(12) United States Patent
Bush et al.

(10) Patent No.: US 10,930,494 B2
(45) Date of Patent: Feb. 23, 2021

(54) VAPOR PHASE TRANSPORT SYSTEM AND METHOD FOR DEPOSITING PEROVSKITE SEMICONDUCTORS

(71) Applicant: Swift Solar Inc., San Carlos, CA (US)

(72) Inventors: Kevin Alexander Bush, San Francisco, CA (US); Maximilian Tobias Hoerantner, San Francisco, CA (US); Tomas Leijtens, Redwood City, CA (US)

(73) Assignee: SWIFT SOLAR INC., San Carlos, CA (US)

( * ) Notice: Subject to any disclaimer, the term of this patent is extended or adjusted under 35 U.S.C. 154(b) by 0 days.

(21) Appl. No.: 16/842,731

(22) Filed: Apr. 7, 2020

(65) Prior Publication Data

US 2020/0328077 A1  Oct. 15, 2020

Related U.S. Application Data

(60) Provisional application No. 62/859,415, filed on Jun. 10, 2019, provisional application No. 62/840,191, (Continued)

(51) Int. Cl.
*C23C 14/22* (2006.01)
*C23C 14/06* (2006.01)
(Continued)

(52) U.S. Cl.
CPC ........ *H01L 21/02271* (2013.01); *B65G 53/16* (2013.01); *C23C 14/0694* (2013.01); *C23C 14/228* (2013.01); *C30B 23/066* (2013.01)

(58) Field of Classification Search
CPC ............. H01L 21/02271; C23C 14/228; C23C 14/0694; C30B 23/066; B65G 53/16
See application file for complete search history.

(56) References Cited

U.S. PATENT DOCUMENTS 5,945,163 A * 8/1999 Powell .................... C03C 17/22
118/724
5,994,642 A * 11/1999 Higuchi .............. C23C 14/0629
136/260

(Continued)

FOREIGN PATENT DOCUMENTS

WO  2016027450 A1  2/2016

OTHER PUBLICATIONS

Àvila, J. et al., "Vapor-Deposited Perovskites: The Route to High-Performance Solar Cell Production?" Joule, pp. 131-442 (2017), vol. 1.
Chen, C.-W., et al., "Efficient and Uniform Planar-Type Perovskite Solar Cells by Simple Sequential Vacuum Deposition." Advanced Materials, pp. 6647-6652 (2014), vol. 26.

(Continued)

*Primary Examiner* — Elizabeth A Burkhart
(74) *Attorney, Agent, or Firm* — Jaffery Watson Mendonsa & Hamilton LLP

(57) ABSTRACT

Vapor phase transport systems and methods of depositing perovskite films are described. In an embodiment, a deposition method includes feeding a perovskite solution or constituent powder to a vaporizer, followed by vaporization and depositing the constituent vapor as a perovskite film. In an embodiment, a deposition system and method includes vaporizing different perovskite precursors in different vaporization zones at different temperatures, followed by mixing the vaporized precursors to form a constituent vapor, and depositing the constituent vapor as a perovskite film.

24 Claims, 17 Drawing Sheets

Related U.S. Application Data filed on Apr. 29, 2019, provisional application No. 62/831,562, filed on Apr. 9, 2019.

(51) Int. Cl.
*H01L 21/02* (2006.01)
*C30B 23/06* (2006.01)
*B65G 53/16* (2006.01)

(56) References Cited

U.S. PATENT DOCUMENTS

| | | | |
|---|---|---|---|
| 6,037,241 | A | 3/2000 | Powell et al. |
| 9,359,668 | B2 | 6/2016 | Xiong et al. |
| 2003/0192471 | A1 | 10/2003 | Jurgensen et al. |
| 2011/0132263 | A1 | 6/2011 | Powell et al. |
| 2012/0028408 | A1* | 2/2012 | Baker .......... C23C 14/228 438/95 |
| 2013/0203202 | A1 | 8/2013 | Xiong et al. |
| 2013/0292485 | A1 | 11/2013 | Liu et al. |
| 2017/0268128 | A1* | 9/2017 | Qi .......... C30B 25/00 |
| 2019/0074439 | A1* | 3/2019 | Banerjee .......... H01L 45/1616 |
| 2019/0081199 | A1 | 3/2019 | Barden et al. |

OTHER PUBLICATIONS

Fan, P., et al., "High-performance perovskite CH3NH3PbI3 thin films for solar cells prepared by single-source physical vapour deposition." Scientific Reports, pp. 1-9 (2016), vol. 6.

Forgacs, D., et al., "Efficient Monolithic Perovskite/Perovskite Tandem Solar Cells." Advanced Energy Material, pp. 1-6 (2017), vol. 7.

Jiang, Q., et al., "Surface passivation of perovskite film for efficient solar cells." Nat. Photonics 13, pp. 460-466 (2019). https://doi.org/10.1038/s41566-019-0398-2.

Liu, M., et al., "Efficient planar heterojunction perovskite solar cells by vapour deposition." Nature, pp. 395-402 (2013), vol. 501.

Yang W.S. et al., "Iodide management informamidinium-lead-halide-based perovskite layers for efficient solar cells.", Science Magazine, pp. 1376-1379 (pp. 1-4 in attached PDF) (2017), vol. 356.

Zhou, D. et al., "Perovskite-Based Solar Cells: Materials, Methods, and Future Perspectives." Journal of Nanomaterials, pp. 1-16 (2018), vol. 2018.

PCT/US2020/027328, "Notification of Transmittal of the International Search Report and the Written Opinion of the International Searching Authority, or the Declaration" dated Jul. 27, 2020, 20 pages.

\* cited by examiner

VAPOR PHASE TRANSPORT SYSTEM AND METHOD FOR DEPOSITING PEROVSKITE SEMICONDUCTORS

RELATED APPLICATIONS

This application claims the benefit of priority of U.S. Provisional Application No. 62/831,562 filed Apr. 9, 2019, U.S. Provisional Application No. 62/840,191 filed Apr. 29, 2019, and U.S. Provisional Application No. 62/859,415 filed Jun. 10, 2019, which are incorporated herein by reference.

STATEMENT AS TO RIGHTS IN INVENTIONS MADE UNDER FEDERALLY-SPONSORED RESEARCH AND DEVELOPMENT

This invention was made with government support under Solar Energy Technologies Office Funding Award No. DE-EE0008750, awarded by the Department of Energy. The government has certain rights in the invention.

BACKGROUND

Field

Embodiments described herein relate to optoelectronic devices, and more particularly to the deposition of perovskite-based solar cell layers by vapor phase transport.

Background Information

Photovoltaic cells, also referred to solar cells, are devices that convert radiant photo energy into electrical energy. Monocrystalline solar cells are dominant in the current solar cell industry, offering some of the highest efficiencies and lifetimes. However, the cost associated with the fabrication of monocrystalline solar cells is a driving factor in the development of alternative solar cell technologies. One class of development is thin-film solar cells. Thin-film solar cells are attractive due to the potential to implement economical in-line processes of deposition and patterning sequences. As thin-film solar cells continue to improve in efficiency they may be candidates to displace currently adopted monocrystalline solar cells at a reduced cost, or create new solar cell markets. Furthermore, some thin-film solar cells can be flexible with potential applications on curved surfaces, mobile devices, or other components. Two such emerging thin-film technologies include cadmium telluride (CdTe) and copper indium gallium selenide (CIGS). More recently metal halide perovskite solar cells have gained attention with a rapid surge in reported cell efficiency.

Various deposition methods have been employed in the research of metal halide perovskite materials including variety of solution-based deposition techniques (such as spin coating, drop casting, spray coating, and various other printing techniques) as well as vapor deposition systems that are generally performed under high vacuum conditions. The various deposition techniques may be further characterized as single deposition processes where the precursors are simultaneously deposited, or sequential deposition processes where the precursor materials are sequentially deposited.

Solution-based techniques may be the simplest methods, though also be associated with more internal defects. In one implementation, a solution containing the organic and inorganic components is spin coated onto a substrate followed by annealing to form an organo metal halide perovskite. In another implementation, a solution containing the inorganic component is first coated onto a substrate, followed by coating of a solution containing the organic component, then annealing.

Vapor deposition methods have been investigated in order to provide higher quality films than solution-based techniques. In one implementation Fan, P. et al. High-performance perovskite $CH_3NH_3PbI_3$ thin films for solar cells prepared by single-source physical vapour deposition. Sci. Rep. 6, 29910, 2016, describes a single source physical vapor deposition (or vacuum thermal evaporation) process in which $MAPbI_3$ powder is placed in a crucible located within a vacuum chamber that is pumped down below $1 \times 10^{-3}$ Pa ($7.5 \times 10^{-6}$ Torr). The crucible is rapidly heated to evaporate or sublimate the powder, which is then deposited onto a glass substrate.

In another implementation, it has been proposed by M. Liu, M. B. Johnston, and H. J. Snaith, "Efficient planar heterojunction perovskite solar cells by vapour deposition," Nature, vol. 501, no. 7467, pp. 395-398, 2013, to use a dual-source vacuum thermal evaporation technique in which $CH_3NH_3I$ and $PbCl_2$ are placed into separate crucibles located within a vacuum chamber. After pumping the chamber down to below $10^{-5}$ mbar ($7.5 \times 10^{-6}$ Torr), the two sources are heated above the deposition temperatures and simultaneously evaporated, followed by annealing.

In another implementation, a sequential vapor deposition method has been proposed by C. W. Chen, H. W. Kang, S. Y. Hsiao, P. F. Yang, K. M. Chiang, and H. W. Lin, "Efficient and uniform planar-type perovskite solar cells by simple sequential vacuum deposition," Advance Materials, vol. 26, no. 38, pp. 6647-6652, 2014 in which $PbX_2$ (where X is a halide) is first deposited by thermal evaporation followed by vapor deposition of a methylammonium halide (MAX). In such an implementation, partial compositions of the end perovskite product are sequentially deposited.

SUMMARY

Embodiments describe vapor phase transport (VPT) systems and methods for depositing a perovskite film. In some embodiments, all perovskite constituent components can be simultaneously fed into a vaporizer from a single constituent powder source. In an embodiment, a VPT method of depositing a perovskite film includes feeding a carrier gas flow and perovskite constituent powder into a vaporizer. The constituent powder can be carried into the vaporizer by the carrier gas flow, gravity, or a combination of the carrier gas flow aided by gravity. The perovskite constituent powder is vaporized in the vaporizer to form a constituent vapor, which is flowed through the vaporizer and onto a target substrate and deposited as a perovskite film on the target substrate. In an embodiment, the constituent vapor can be supplemented with a precursor vapor prior to depositing the perovskite film. For example, an organic precursor can be separately vaporized and fed into the vaporizer to tune the constituent vapor composition due to some amount of organic precursor degradation in the system.

In an embodiment, a VPT system includes powder supply and a powder supply and a carrier gas source connected to the powder supply, a vacuum chamber, and substrate holder within the vacuum chamber. A vaporizer, to receive and vaporize powder from the powder supply, is connected with the vacuum chamber, and a filter is coupled with the vaporizer. In an embodiment, the filter has a porosity of at least 50 pores per inch. The filter may additionally span across/fill a vapor path through a sub-chamber (e.g. quartz tube) within the vaporizer and have relatively two-dimensional filter surfaces (incoming and outgoing). In an embodiment, a supplemental gas source can be connected to the vacuum chamber and vaporizer to supply a precursor vapor and supplemental carrier gas to the vapor path for example, within the vaporizer. Though the precursor vapor and supplemental carrier gas can be combined elsewhere along the vapor path, such as downstream from the vaporizer.

In some embodiments, all perovskite precursors can be simultaneously fed into a vaporizer from a single constituent solution source. In an embodiment, a VPT method of depositing a perovskite film includes feeding a carrier gas flow and perovskite solution into a vaporizer. The perovskite solution is vaporized in the vaporizer to form a constituent vapor, which is flowed through the vaporizer and onto a target substrate and deposited as a perovskite film on the target substrate. In an embodiment, the constituent vapor can similarly be supplemented with a precursor vapor prior to depositing the perovskite film.

In an embodiment a vapor phase transport system includes a vacuum chamber, a vaporizer contained within the vacuum chamber, a gas inflow component inlet to the vaporizer, a liquid precursor supply component inlet to the vaporizer, a vaporizer outlet, and a substrate holder in the vacuum chamber. In an embodiment, the liquid precursor supply component is coupled with the gas inflow component to produce an aerosolized solution in the vaporizer. The liquid precursor supply component may include a constricted channel to transport the liquid precursor at a higher velocity at an outlet of the constricted channel that at an inlet of the constricted channel. The vaporizer may include a tube that is completely enclosed along its longitudinal length. Additionally, the gas inflow component inlet and the liquid precursor supply component inlet may be located at a first end of the tube, while an outlet connected to the nozzle is located at a second end of the tube.

In some embodiments, different perovskite precursors are separately vaporized and then mixed to be deposited as a perovskite film. In an embodiment, a VPT system includes a vacuum chamber, a first vaporization zone coupled with the vacuum chamber, a second vaporization zone coupled with the vacuum chamber, a first precursor supply assembly coupled with an inlet to the first vaporization zone, a second precursor assembly coupled with an inlet to the second vaporization zone, and a substrate holder.

The VPT system may be configured to support both liquid and solid precursors, multiple solid precursors, and multiple liquid precursors. In an embodiment, the second precursor supply assembly is a solid precursor supply assembly. For example, the solid precursor supply assembly can include a powder supply coupled with a carrier gas source to supply a powder from the powder supply to the second vaporization zone. A filter may be located downstream from the second vaporization zone, or within the second vaporization zone. In an embodiment, the filter is characterized by a porosity of at least 50 pores per inch. In an embodiment, the filter includes a wire mesh or foam.

In an embodiment the first precursor supply assembly is a liquid precursor supply assembly. Such a liquid precursor supply assembly can include a liquid precursor supply component coupled with a gas inflow component to produce an aerosolized solution in the first vaporization zone. In an embodiment, the first vaporization zone is in a first vaporizer that includes a tube which is completely enclosed along its longitudinal length, a gas inflow component inlet to the tube, and a liquid precursor supply inlet to the tube. The gas inflow component inlet and the liquid precursor supply component inlet are located at a first end of the tube, and a vapor outlet of the first vaporizer is located at a second end of the tube.

The VPT systems in accordance with embodiments may have one or more temperature zones associated with each vaporizer. For example, the temperature zones may correspond to temperatures needed for vaporization and/or sublimation of the precursors, or to prevent existing precursor vapors from sticking. In some embodiments, the vaporization zones are arranged in separate fluid streams, and each fed into a mixer or supply line for mixing. In some embodiments, the vaporization zones are arranged serially, with precursor vapor from a first vaporization zone being fed into a second vaporization zone downstream from the first vaporization zone. In some embodiments, precursor vapor from the vaporization zones is fed into a man carrier gas stream in a gas supply line. For example, a second precursor vapor from a second vaporization zone can be fed to the supply line downstream from where a first precursor vapor is fed into a supply line.

The VPT systems in accordance with embodiments may be used to deposit perovskite films via single or multiple precursor sources, and with one or more temperature zones. This may include feeding organic precursors together or separately, and feeding inorganic precursors together or separately.

DETAILED DESCRIPTION

Figure 1:
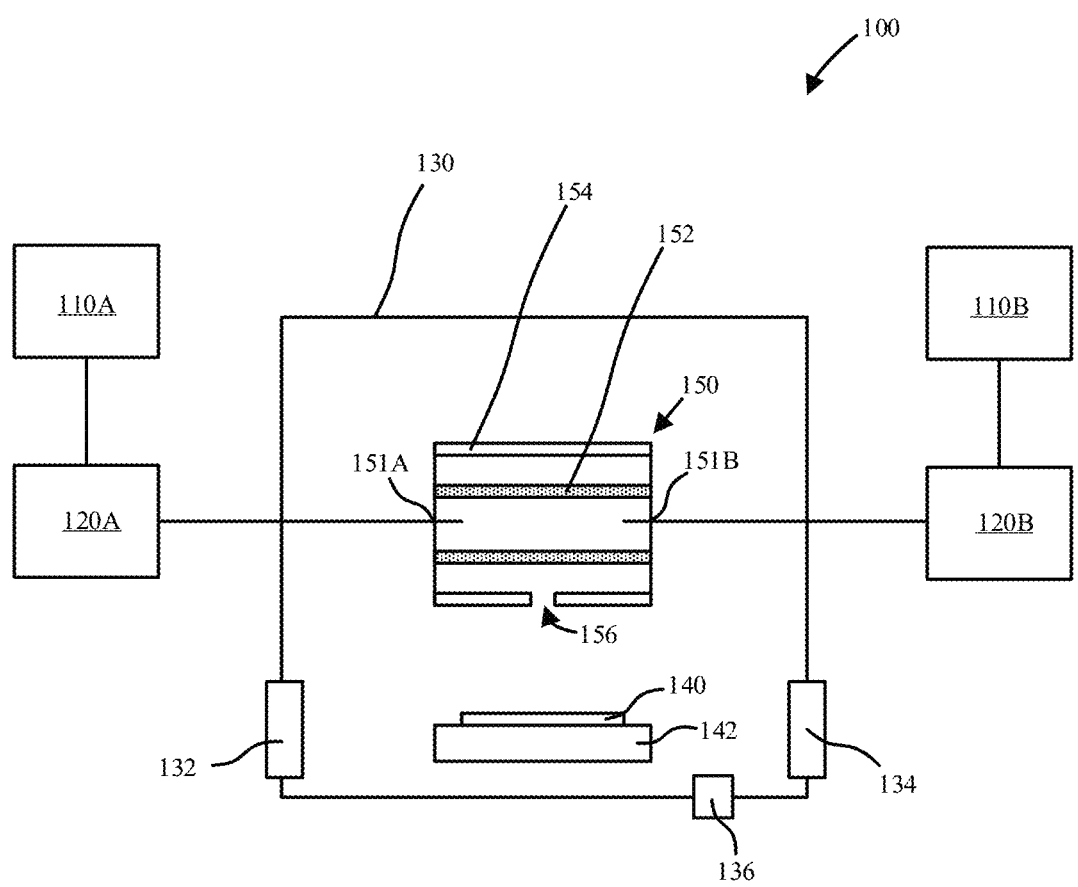
FIG. 1 is a schematic illustration of a conventional vapor transport deposition (VTD) system.

Embodiments describe single and multiple source vapor deposition techniques for the formation of perovskite-based solar cell layers. In an embodiment, the perovskite precursors are formed into a powder. The powder is supplied as a continuous or semi-continuous feed, rapidly vaporized, and deposited onto a cooled substrate. In an embodiment, the perovskite film precursors are dissolved in a solvent or combination of solvents to form a single perovskite solution. The perovskite solution is supplied as a continuous feed, aerosolized, rapidly vaporized, and deposited onto a cooled substrate as a perovskite film.

In an embodiment, different perovskite precursors can be separately vaporized, then mixed and deposited as a perovskite film. In such embodiments, specific perovskite precursors may be vaporized in different temperature zones, thus controlling vaporization rate and exposure to elevated temperatures. Additionally, different precursors can be supplied to the vaporizers using different feed rates, techniques and states, such as in the solid or liquid state.

In an embodiment, a vapor phase transport (VPT) system includes a vacuum chamber, first and second vaporization zones coupled with the vacuum chamber, a first precursor supply assembly coupled with an inlet to the first vaporization zone, a second precursor assembly coupled with an inlet to the second vaporization zone, and a substrate holder. A method of operating such a VPT system may include feeding a first precursor to the first vaporization zone to form a first precursor vapor, feeding a second precursor to the second vaporization zone to form a second precursor vapor, mixing the first precursor vapor with the second precursor vapor to form a constituent vapor, and depositing the constituent vapor as a perovskite film on a target substrate. In accordance with some embodiments, the first and second vaporization zones may be in separate fluid streams, with corresponding outlets feeding to a mixer. In accordance with other embodiments, the first and second vaporization zones may be in-line, with an outlet from the first vaporization zone feeding to an inlet to the second vaporization zone. In accordance with other embodiments, the first and second vaporization zones may feed into a supply line carrying a supplemental carrier gas stream which can also include a precursor vapor. In an exemplary application, the second precursor vapor (e.g. corresponding to an inorganic precursor) in the second vaporization zone is at a higher temperature than the first precursor vapor (e.g. corresponding to an organic precursor) in the first precursor. Once mixed, the constituent vapor temperature may be higher than the first precursor vapor in the first vaporization zone, and lower than the second precursor vapor in the second vaporization zone. Embodiments are not limited to the exemplary systems of two precursor supplies and two vaporization zones, and additional precursor supply assemblies and vaporizers may be incorporated.

A variety of precursor mixtures and combinations are possible. An exemplary single precursor feeding system can include all organic/inorganic precursors to deposit a perovskite film. An exemplary two precursor feeding system can be organic/inorganic or organic/perovskite, where the perovskite includes both organic and inorganic precursors. The feeding system can be expanded to separate inorganic precursors. For example, metal-halides and alkali-halides may be supplied separately in a three precursor feeding system, with the other precursor being organic-halides. In such a system the metal-halide precursor may be an alloy of metal halides. The metal halides may additionally be fed separately, for example in a four precursor feeding system.

In accordance with embodiments exposure time of the precursors to elevated temperatures can be mitigated. For example, the precursor vapors can be flowed through the vaporizer(s) and onto the target substrate in less than two seconds, such as less than 0.5 seconds. This may be aided by use of carrier gas. Furthermore, the VPT system may be operated at low vacuum. For example, the vaporizers may be maintained at a pressure of 1-50 Torr, or less than 10 Torr, such as 1-10 Torr or lower, such as $10^{-4}$-1 Torr.

In one aspect, it has been observed that use of conventional vapor deposition systems in the production of hybrid organo-metal-halide perovskite materials generally leads to high fabrication costs because of capital intensive vacuum parts and reduced processing speed. Furthermore, simultaneous deposition is difficult because of differences in vapor pressures and instability of the organic precursors. For example, organic halide precursors can begin to sublimate at temperatures as low as 70° C., while the inorganic halide precursors melt or vaporize at much higher temperatures. For example, $PbI_2$ melts at 400° C., and CsI melts at 620° C. The VPT systems and processes in accordance with embodiments may facilitate a short residence time in vapor phase (less than two seconds, or more specifically less than 0.5 seconds). Furthermore, contrary to conventional vapor deposition techniques, the VPT processes in accordance with embodiment may be performed at low vacuum (e.g. $10^{-4}$ Torr and higher pressures), with a carrier gas flow.

VPT deposition in accordance with some embodiments may occur at low vacuum pressures that facilitate laminar or molecular flow of the vapor streams. For example, the vapor stream through any of the sub-systems (e.g. quartz tubes), deposition head, and mixing nozzles may be characterized by a Reynolds number, that is affected by various deposition and system parameters including temperature, pressure, flow velocity, fluid density, system dimensions, etc. A Reynolds number between 1-2,000 can correspond to laminar flow, while a Reynolds number above 4,000 can be associated with turbulent flow. While various deposition heads and nozzles can be used at any pressure in accordance with embodiments to facilitate mixing or controlling directionality of the perovskite constituents in the vapor stream, it may be most relevant in the pressure regimes between 0.1-10 Torr. At pressures lower than 0.1 Torr, the flow will enter a molecular flow regime or Stokes flow, where ballistic transport dominates rather than the vapor following laminar flow lines. Thus, in accordance with embodiments, the target substrate can be positioned directly underneath an outlet/open end of a vaporizer sub-chamber, or separate deposition head or mixing nozzle.

In accordance with embodiments, the target substrates can be a variety of materials including glass and plastic, including low temperature polymer. In some embodiments the target substrate may be cooled below 200° C., or more specifically below 150° C. These temperatures may help mitigate warping or other degradation of the target substrate. It has been observed when depositing onto low temperature substrates in particular that a minimum working distance of the vapor stream may need to be maintained to prevent excessive heat transfer to the target substrate during deposition. Furthermore, flow characteristics of the vapor stream and chamber pressure need to be controlled to prevent premature precipitation of the perovskite prior to reaching the target substrate, while maintaining an economical deposition rate.

In some embodiments operating at relatively higher pressure (e.g. laminar flow), a relatively shorter vapor source exit to substrate distance such as <4 cm can be used as the vapor exiting the vaporizer outlet/nozzle/deposition head can rapidly cool due to interaction with the cooler gas molecules between the vaporizer outlet/nozzle/deposition head and the target substrate. While such a short (e.g. <4 cm) vapor source exit to substrate distance can increase materials utilization, it can also result in a significant heat load on the target substrate due to convection and radiation. Thus, to minimize substrate heat load, especially important for deposition on plastics, a larger vapor source exit to substrate distance (e.g. >4 cm) may be advantageous, as radiative heating from the source is proportional to the square of the distance and convective heating is proportional to pressure. To prevent significant cooling of the exiting vapor stream, which could lead to particulate formation prior to reaching the substrate, lower pressures (<1 Torr) and molecular flow may be used. It is to be appreciated that the +/−4 cm distance is exemplary, and embodiments are not so limited.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

FIG. 1 is a schematic illustration of a conventional vapor transport deposition (VTD) system 100 used to deposit a thin film layer onto a substrate 140. As shown the VTD system 100 includes inert carrier gas sources 110A, 110B to provide a carrier gas to powder supplies 120A, 120B, respectively. The carrier gases transport the powder material through injector ports 151A, 151B on opposite ends of a vaporizer 150. As shown, the vaporizer 150, substrate holder 142, and substrate 140 are arranged within a vacuum chamber 130 that may be pumped to a low vacuum. Vacuum chamber 130 may additionally include an exhaust 136 to for exhausting the vacuum chamber to remove carrier gas. Entry and exit stations 132, 134 can additionally be constructed as load locks or slit seals for the substrate 140, and optionally substrate holder 142, to enter and exit the vacuum chamber 130.

The vaporizer 150 for a conventional VTD system 100 includes a permeable member 152, that is preferably of elongated tubular construction. Specifically, an electrically conductive permeable member 152 can be heated to a temperature between at least 800° C. to 1200° C. by application of an electrical current. The permeable member 152 is contained within a shroud 154, also of elongated tubular shape, that includes an opening 156. In operation, the carrier gas and powder are transported into the interior of the permeable member 152, where the powder is vaporized or sublimated. The vapor then diffuses through pores in the permeable member 152 and is directed through the opening 156 in the shroud 154 and onto the substrate 140, which is held at a lower temperature to facilitate deposition of the vapor composition. A conventional permeable member 152 is typically used to prevent particulates which failed to vaporize from going through the opening 156 and onto the substrate 140, and also function as a buffer zone to even out the deposition rate. Preferably the conventional permeable member 152 is electrically conductive and is often made of silicon carbide.

Such a VTD system 100 and process may be used to deposit CdTe thin film semiconductors for the optoelectronics industry. This can be accomplished at very high rates, and the carrier gas enables higher material utilization than simple evaporation techniques. Additionally, VTD is typically done at higher pressure (e.g. 1-50 Torr) than evaporation (e.g. $10^{-6}$ Torr), simplifying pump requirements and vacuum capability. Significantly, VTD of CdTe is assisted by a eutectic between Cd and Te at 50% Cd and 50% Te at around 600-650° C. This enables the correct compound to crash out by controlling the temperature of the substrate (e.g. glass substrate).

Of particular significance, is that there is no simple eutectic for perovskites, and even more significantly, the inorganic metal halide precursors and organic halide precursors for perovskites have very different vapor pressures, leading to discrepancies in vaporization temperatures of hundreds of degrees. Specifically, the organic halides (such as methylammonium iodide (MAI), formamidinium iodide (FAI), dimethylammonium iodide (DMA), phenethylammonium iodide, butylammonium iodide, guanidinium iodide, etc.) will decompose over time at the temperatures necessary to vaporize the inorganic precursors such as lead (II) iodide ($PbI_2$), tin iodide ($SnI_2$), cesium iodide (CsI), and potassium iodide (KI). This incongruency in vaporization temperature makes the traditional methods of vapor depositing CdTe or organic semiconductors not directly applicable to VTD of perovskites.

While the organic precursors degrade at the higher temperature necessary to vaporize the inorganic precursors, the degradation follows first order reaction rate kinetics. Thus, the extent of degradation is dependent upon the process pressure, concentration of the organic, temperature, and reaction time. Minimizing each of these factors can mitigate the extent to which the organic component degrades before deposition. In accordance with embodiments, residence time of the perovskite constituent(s) in the vapor phase may be minimized. In particular, exposure time of the organic precursor materials to higher temperatures associated with vaporization of the inorganic precursors can be minimized, along with the potential for degradation.

In one aspect, the perovskite vaporization and deposition methods and VPT systems in accordance with embodiments can utilize a single perovskite source (e.g. powder, liquid) to provide a continuous feed of the perovskite composition or precursors. Such a single source feeding system may avoid pitfalls with multiple feed systems, and the potential for achieving films with undesired stoichiometry.

In one aspect, the multiple source VPT systems and methods in accordance with embodiments may provide separate feeds and/or vaporization zones for organic precursors and/or inorganic precursors. Such a multiple source system may minimize exposure time of the organic precursor materials to higher temperatures associated with vaporization of the inorganic precursors, and the potential for degradation.

The VPT systems in accordance with embodiments may also not include a conventional electrically conductive permeable member. Omission of a conventional electrically conductive permeable member slows energy transfer with the organics because the frequency of collisions between the organics and the walls of the electrically conductive permeable member would be much higher than the frequency of collisions within a low pressure gas stream. Thus, an organic component's mean free path in a vapor stream may be on the order of millimeters whereas it could be of tens of microns in a conventional electrically conductive permeable member.

As used herein, the term "perovskite precursor" refers to one or more precursors necessary for deposition of a perovskite film. For example, a perovskite precursor may include one more organic precursors (such as one or more organic halide precursors), one or more inorganic precursors (such as one or more metal halide precursors, and/or or more alkali halide precursors), and combinations thereof. As used herein the terms "perovskite constituent powder" or "perovskite solution" refer to either a perovskite chemical composition or the precursors used to deposit a perovskite film. Thus, a constituent powder may include perovskite powder, or alternatively powders of the perovskite precursors. Similarly, a perovskite solution may include a dissolved perovskite or the dissolved perovskite precursors. As used herein the term "constituent vapor" may refer to a vapor mixture including all precursors (e.g. a vaporized perovskite powder or vaporized precursors) necessary to deposit a perovskite film. Furthermore, the perovskite constituent powder, perovskite solution, and constituent vapor may not necessarily stoichiometrically match the stoichiometry of the deposited perovskite films. For example, there may be a lower yield of the organic precursors due to degradation and poor incorporation into the final perovskite film. Thus, in some embodiments, the constituent power, perovskite solution, and constituent vapor may contain excess organic precursor in order to achieve a final film with the desired stoichiometry. Accordingly, the terms "perovskite constituent powder," "perovskite solution" and "constituent vapor" refer to the composition that results in a perovskite film composition. In accordance with embodiments, these compositions can be supplemented with a precursor vapor. For example, an organic precursor can be separately vaporized and combined with/added to the constituent vapor to compensate for some amount of organic precursor degradation in the system.

Perovskite may have a general formula of $ABX_3$, where A is an organic cation (e.g., methyl-ammonium (MA), ethyl-ammonium (EA), formamidinium (FA), guanidinium (GA), phenethylammonium (PEA), dimethylammonium (DMA), butylammonium (BA), benzylammonium (BEA), diethylammonium (DEA), imidazolium, phenylammonium, etc.) or inorganic cation (e.g. $Cs^{2+}$, $Sn^{2+}$, $Ru^+$, $K^+$, $Na^+$), B is a metal cation (e.g., $Ge^{2+}$, $Sn^{2+}$, $Pb^{2+}$) and X stands for the halide anion (e.g., $F^-$, $Cl^-$, $Br^-$, $I^-$).

In accordance with embodiments, an organic precursor may include an organic halide, which combines an organic cation listed above with a halide anion listed above. Exemplary organic precursors (organic halides) include, but are not limited to, methyl-ammonium iodide (MAI) and formamidinium iodide (FAI) dimethylammonium iodide, phenethylammonium iodide, butylammonium iodide, guanidinium iodide, etc. In accordance with embodiments, a precursor supply assembly may supply an organic precursor (e.g. organic halide) or a mixture of organic precursors (e.g. MAI/FAI).

In accordance with embodiments, an inorganic precursor may include a metal halide ($PbI_2$, $SnI_2$, $PbBr_2$, $SnBr_2$, $PbCl_2$, $SnCl_2$, $SnF_2$) and optionally an alkali halide (CsI, CsBr, CsCl, RbI, RbBr, RbCl, KI, KBr, KCl). In accordance with embodiments, a precursor supply assembly may supply an inorganic precursor (inorganic halide) including one or more metal halides, and optional alkali-halides. To further circumvent the complexities associated with a multitude of precursors, the inorganic components can be alloyed together. For example, the group IV metal halides may be alloyed together. In particular, all of the lead and tin halides can be alloyed together to achieve $Pb_zSn_{(1-z)}X_2$ alloys, where X is a halide. Ball milling of the inorganic perovskite precursor alloys enables the creation of mixtures of alloys and non-alloyed precursor powders to achieve the desired ratio in the final film upon being combined with the organic halide components.

In accordance with embodiments, the perovskite precursors can be easily combined together to form a perovskite powder. One way of forming this perovskite powder is by ball milling the perovskite precursors together—combining $PbI_2$, CsI, $SnI_2$, FAI, DMA, and MAI—in stoichiometric (or near stoichiometric) ratios. Some embodiments may add excess of either $PbI_2$ or the organics ratios. Thus, the constituent powder compositions may optionally have different stoichiometries than the final deposited films. Combining the inorganic and organic precursors together in the same powder may reduce challenges associated with timing different material feeds, and the possibility of undesired stoichiometry.

In accordance with embodiments, the perovskite precursors can be dissolved in several different polar solvents such as isopropyl alcohol (IPA), ethanol, N,N-Dimethylformamide (DMF), dimethyl sulfoxide (DMSO), N-methyl-2-pyrrolidone (NMP), acetonitrile, dimethylacetamide, gamma-butyrolactone (GBL), or amine-based solvents such as pyridine, methylamine, butylamine, water, etc. In addition, the perovskite precursor solution(s) may include a host solvent, such as but not limited to, acetonitrile or ethanol. Thus, the perovskite precursor solution(s) may include perovskite precursors and one or more solvents, which may be liquid mixtures. In an embodiment, the perovskite precursor solution includes at least one solvent capable of dissolving all precursors in the solution. In an embodiment, the perovskite precursor solution includes multiple solvents that are each capable of dissolving all precursors in the solution.

In accordance with embodiments, a single perovskite solution is prepared by dissolving the perovskite precursors, organic and inorganic halide components alike, in one or more polar solvents such as N,N-Dimethylformamide (DMF), dimethyl sulfoxide (DMSO), N-methyl-2-pyrrolidone (NMP), acetonitrile, dimethylacetamide, gamma-butyrolactone (GBL), or amine-based solvents such as pyridine, methylamine, butylamine, etc. In addition, the single perovskite solution may include a host solvent, such as but not limited to, acetonitrile or ethanol. Thus, the perovskite solution may include perovskite precursors and one or more solvents, which may be liquid mixtures. In an embodiment, the perovskite solution includes at least one solvent capable of dissolving all precursors. In an embodiment, the perovskite solution includes multiple solvents that are each capable of dissolving all precursors.

Certain solvents such as DMF, among others, may degrade at the higher vaporization temperatures. For example, DMF thermally degrades into dimethylamine and formic acid. Solvents such as GBL may produce less potentially harmful degradation products. Yet solvents such as GBL and DMSO have relatively higher boiling points, which may require heating the target substrate to a higher temperature to prevent solvent condensation. Yet boiling point can be reduced at lower pressure. Thus, solvents may be selected based on a variety of criteria.

Additives other than perovskite precursors may also be included in the perovskite solution, perovskite precursor solution and/or a solid perovskite precursor supply. For example, polymers, thiocyanate salts, chloride containing precursors such as methylammonium chloride or lead chloride, alkali metal halides, and small molecules such as fullerenes can be added to name a few. In an embodiment a crystallization aid is added. Examples of crystallization aids can include but are not limited to amine gases (methylamine, ammonia, imidazole, pyridine, to name a few), large organic ammonium halide salts (e.g. Phenethylammonium halide, Butylammonium halide, Phenylammonium halide etc.), thiocyanate salts, chloride containing salts, solvents (such as DMF, DMSO, NMP, GBL).

Precursor solutions may include any class of precursors (e.g. organic precursors such as organic halide, or inorganic precursors such as metal halide or alkali halide, etc.), or combination of precursors. In an embodiment, a precursor solution includes the organic halides dissolved in a solvent such IPA. Inorganic precursors may optionally be dissolved in a more polar solvent, or provided as a solid precursor.

In a specific embodiment, a perovskite solution may include a liquid solution of $PbI_2$, CsI, $SnI_2$, FAI, DMA, and MAI—in stoichiometric (or near stoichiometric) ratios. Some embodiments may add excess of either $PbI_2$ or the organics ratios. Thus, the perovskite solution compositions may optionally have different stoichiometries than the final deposited perovskite films. Combining the inorganic and organic precursors together in the same solution may reduce challenges associated with timing different material feeds, and the possibility of undesired stoichiometry.

With the multiplicity of organic and inorganic cations that could be used on the "A" site of the perovskite with generic formula $ABX_3$ (such as Cs+, formamidinium (FA), methylammonium (MA), Rubidium (Rb), Potassium (K), Sodium (Na), Guanidinium (GA), Phenethylammonium (PEA), Dimethylammonium (DMA), Butylammonium (BA), Ethylammonium (EA), benzylammonium (BEA), Diethylammonium (DEA), Imidazolium, phenylammonium, etc.), highly controlled material feed can be important for both powder and solution systems. Similarly, inorganic precursors such as $PbI_2$, $SnI_2$, $PbBr_2$, $SnBr_2$, $PbCl_2$, $SnCl_2$, $SnF_2$, CsI, CsBr, CsCl, RbI, RbBr, RbCl, KI, KBr, KCl, need to be accurately fed into the system to reach the desired stoichiometry in the final film.

An exemplary $MAPbI_3$ perovskite can be obtained by combining $PbI_2$ (inorganic precursor) and MAI (organic precursor). Any of the organic precursors listed in addition to any of the alkali metal halides (CsI, CsBr, CsCl, RbI, RbBr, RbCl, KT, KBr, KCl) can be combined in a roughly 1:1 ratio with any of the group IV metal halides ($PbI_2$, $SnI_2$, $PbBr_2$, $SnBr_2$, $PbCl_2$, $SnCl_2$, $SnF_2$).

Figure 2:
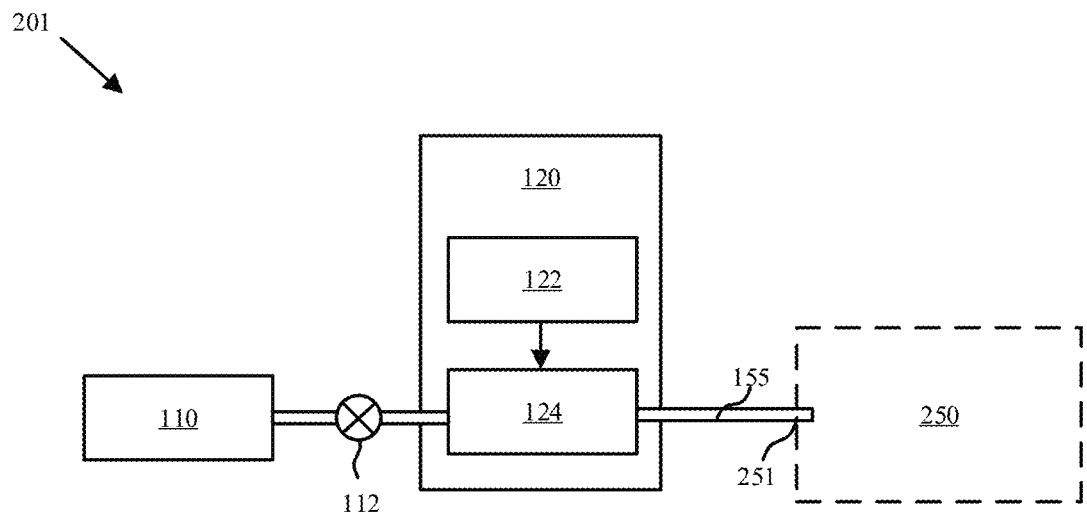
FIG. 2 is a schematic illustration of a VPT system solid precursor supply assembly in accordance with embodiments.
Figure 3:
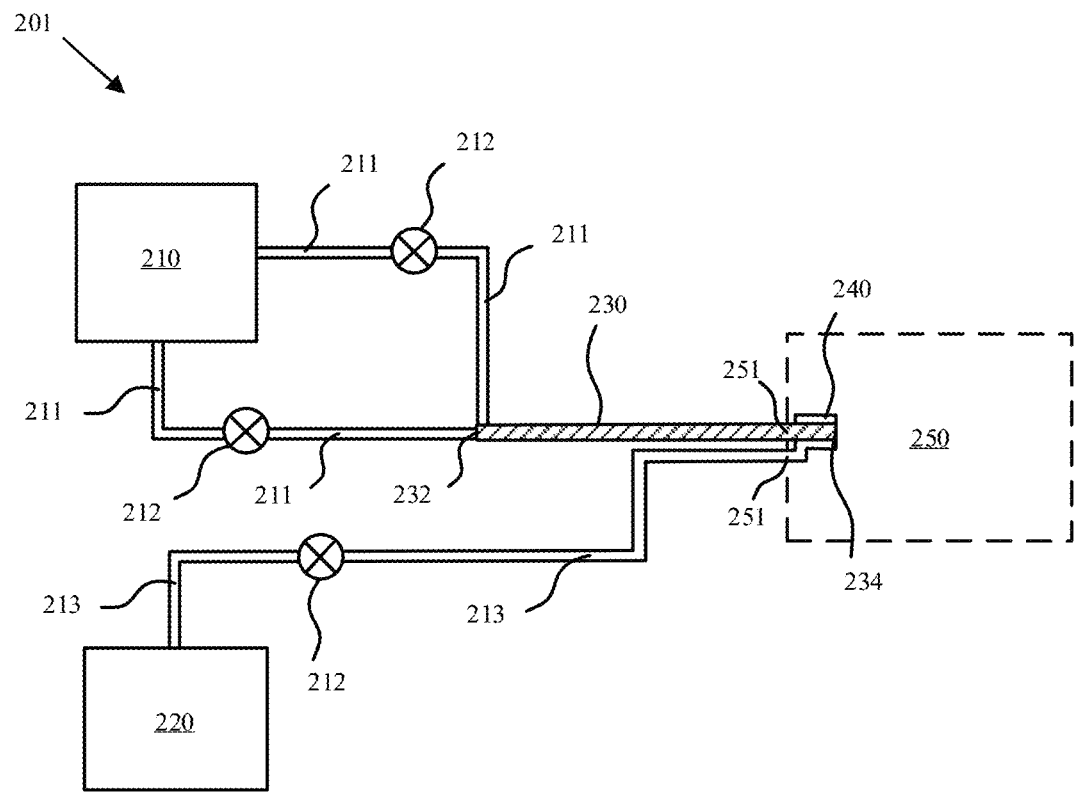
FIG. 3 is a schematic illustration of a VPT system liquid precursor supply assembly in accordance with embodiments.

The VPT systems in accordance with embodiments may include precursor supply assemblies for solid precursor sources, liquid precursor sources, and combinations thereof. FIG. 2 is a schematic illustration of a VPT system solid precursor supply assembly 201. FIG. 3 is a schematic illustration of a VPT system liquid precursor supply assembly 201. As shown, there is a gas inflow component which includes a carrier gas source 110 and controller 112, such as a mass flow controller (MFC). The gas inflow component is connected to a powder supply 120, which includes a powder source 122, such as a hopper, and material feeder 124. The material feeder 124 feeds the powder from powder source 122 into the transport gas stream from the gas inflow component. The gas inflow stream is provided to supply line 155 which connects to vaporizer 150 through input 251.

In some embodiments, the powders may flow/fall from the powder source 122 into the material feeder 124 which will serve to meter the output of perovskite constituent powders. In an embodiment, the material feeder 124 is a boat, where the powder is evaporated. The powder may also be buffered and include an inert filler. The material feeder 124 may be an auger screw, rotating screw feeder, vibratory feeder, fluidized bed feeder, rotary disk feeder. Each of these methods can meter the feed rate by changing rotation rate, vibration frequency, or amplitude. A carrier gas (e.g. nitrogen, helium, argon, etc.), metered by controller 112 (e.g. MFC), may flow through the material feeder 124. At high flow rates the carrier gas may carry the constituent powder through the supply line 155, while at lower flow rates may prevent backflow of vapor. In some embodiments, this may be in the form of an aerosolized powder, though it is not necessarily required that the constituent powder is suspended in the carrier gas. The carrier gas may carry the constituent powder without the constituent powder being suspended in the carrier gas. In some embodiments, the carrier gas flow can be aided by gravity to carry the constituent powder. Alternatively, the constituent powder can be carried into the vaporizer by gravity. In accordance with embodiments, a continuous or semi-continuous feed of perovskite precursor powder, e.g. perovskite precursor aerosol, may be supplied to the vaporizer 150 in order to achieve uniform and continuous deposition.

The precursor powder and the carrier gas will flow into the vaporizer 150 where it will be rapidly vaporized. Smaller particle diameters achieved with longer ball-milling times may be utilized because they evaporate more quickly and require lower vaporization temperatures. For example, the precursor powders may have a 95% particle size less than 1 mm, or more specifically a 95% particle size less than 100 µm, though this is not necessarily required. In an embodiment, this process occurs at lower pressure (e.g. less than 100 Torr, or more specifically less than 10 Torr such as 1-10 Torr or lower, such as $10^{-4}$-1 Torr) and the precursor vapor travels through the vaporizer 150 to the substrate 140 in under two seconds, or more specifically under 0.5 seconds. Notably, the continuous or semi-continuous feed of the precursor powder into the vaporizer can be used to limit high temperature exposure time of the precursors.

Referring now to FIG. 3 a schematic illustration is provided of a VTD system liquid precursor supply assembly 201 accordance with embodiments. As shown, there is a gas inflow component which includes a carrier gas source 220 and controller 212, such as a mass flow controller (MFC). The gas inflow component is connected to a liquid precursor supply component, which includes one or more storage tanks 210 and one or more controllers 212, such as syringe pumps or MFCs. A continuous feed may be achieved by dispensing of the liquid solution by pressure. While there may be only one controller 212 and supply line 211, in accordance with embodiments there may be at least two controllers 212 and corresponding supply lines 211 plumbed in parallel so that one controller can be shut off while the other is in operation. For example, where controller 212 is a syringe pump, this may allow one to be refilled while the other is in operation, thus enabling a continuous feeding system. Syringe pumps are capable of injecting solution at highly controlled rates as low as microliters per second. Where the one or more controllers 212 are mass flow controllers, a storage tank 210 above the MFC(s) may provide the necessary hydrostatic pressure to inject the perovskite solution.

The liquid precursor solution metered by controller(s) 212 is optionally fed into an inlet 232 of constricted channel 230. For example, supply line 211 may optionally be connected to the inlet 232. An outlet 234 of the constricted channel 230 may be connected to a spray nozzle 240. Alternatively, the constricted channel 230 may be a part of spray nozzle 240. In the embodiment illustrated, the gas inflow component is connected to the liquid precursor supply component at the spray nozzle 240. For example, supply line 213 may be connected to the spray nozzle 240. The spray nozzle 240 may combine the carrier gas with the precursor solution to create an aerosolized precursor solution, which is fed into the vaporizer 150. The carrier gas inflow and the constricted channel 230 may serve to create a pressure drop so that the precursor solution need not be at as low of a pressure.

Spray nozzle 240, which may be connected to the constricted channel 230 or include the constricted channel 230, may create an aerosolized precursor solution. Spray nozzle 240 may be an ultrasonic spray nozzle (where the solution is sheared into small droplets by ultrasonic waves) or an air-atomizing spray nozzle (where the solution is sheared into droplets by a carrier gas), or nebulizer, for example. Spray nozzle 240 may also be formed with a solenoid actuator which opens and closes rapidly to emit droplets of solution. In each of the configurations the carrier gas, such as nitrogen, argon, compressed dry air, or helium, metered by controller 212, can flow alongside (e.g. surrounds) the perovskite solution to create the liquid aerosol. In accordance with embodiments, the liquid perovskite solution is sheared into droplets as it leaves the spray nozzle 240 into the high temperature zones in the vaporizer 250. Breaking the liquid stream into droplets with either solenoid on/off pulsing, ultrasonic waves or shear force overcomes surface tensions as the liquid leaves the constricted channel and enables a more continuous flow of liquid into the vaporization zone. Additionally, the vaporization rate will be dependent upon the droplet size and smaller droplet size may again be favored as it enables a faster vaporization rate.

The constricted channel 230 may function to hold the precursor solution with sufficient surface tension to prevent the solution from being vaporized by a lower pressure zone downstream. This may be achieved by providing a narrow channel (e.g. less than 2 mm or less than 1 mm in width, or diameter) through which the precursor solution flows through the constricted channel 230. The constricted channel may also be a porous membrane. Both structures may create a flow velocity differential between the inlet 232 and outlet 234. Furthermore, the precursor solution may be subjected to a pressure differential between the inlet 232 and outlet 234. In an embodiment, the precursor solution sees greater than 100 Torr pressure differential between the inlet 232 and outlet 234. In an embodiment, the precursor solution flow velocity is greater at the outlet 234 than at the inlet 232. In the embodiment illustrated, inlet 232 is located outside the vacuum chamber 130. The precursor solution in storage tank 210 may be at standard pressure 760 Torr. Likewise, the precursor solution in supply line 211 may be at approximately standard pressure 760 Torr at inlet 232. The outlet 234 is connected to the spray nozzle 240, which sees the vacuum pressure from the vacuum chamber 130. Thus, a front of the precursor solution at outlet 234 may be exposed to a pressure of less than 660 Torr. Furthermore, the precursor solution may be subjected to a temperature differential between the inlet 232 and outlet 234, with the outlet 234 located in a corresponding temperature zone of the corresponding vaporizer. The inlet 232 may be maintained at a lower temperature, or even standard temperature.

Figure 4:
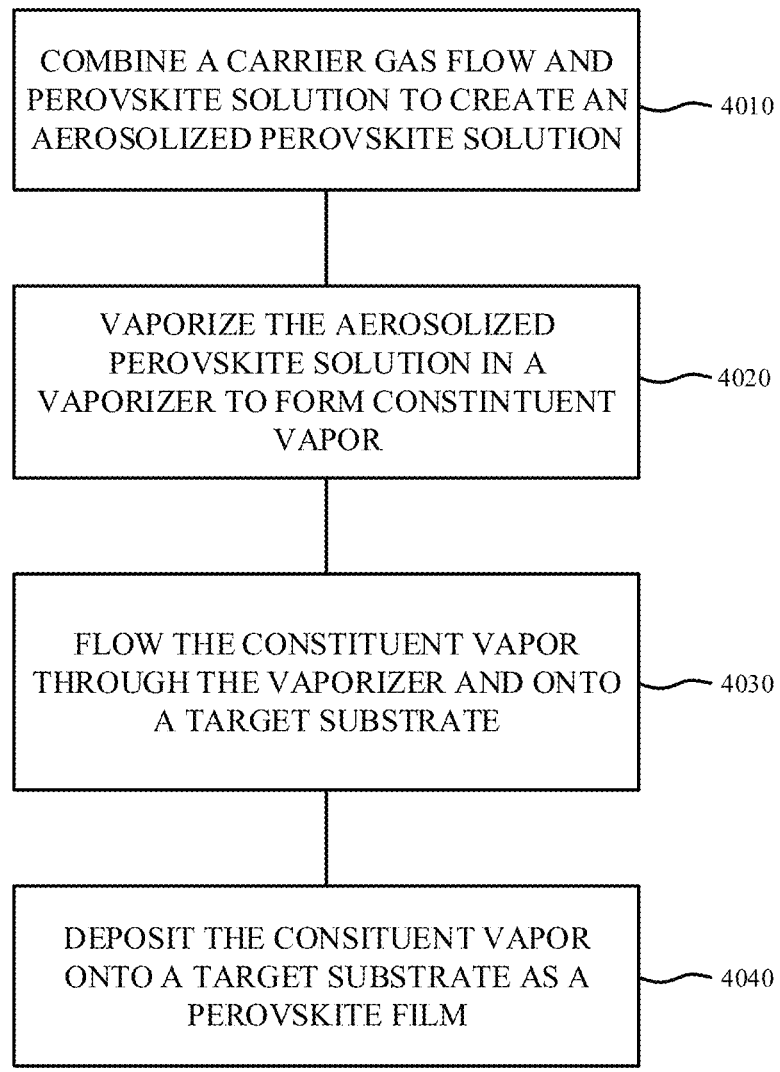
FIG. 4 is a flow diagram illustrating operation of a VPT system in accordance with an embodiment.
Figure 5:
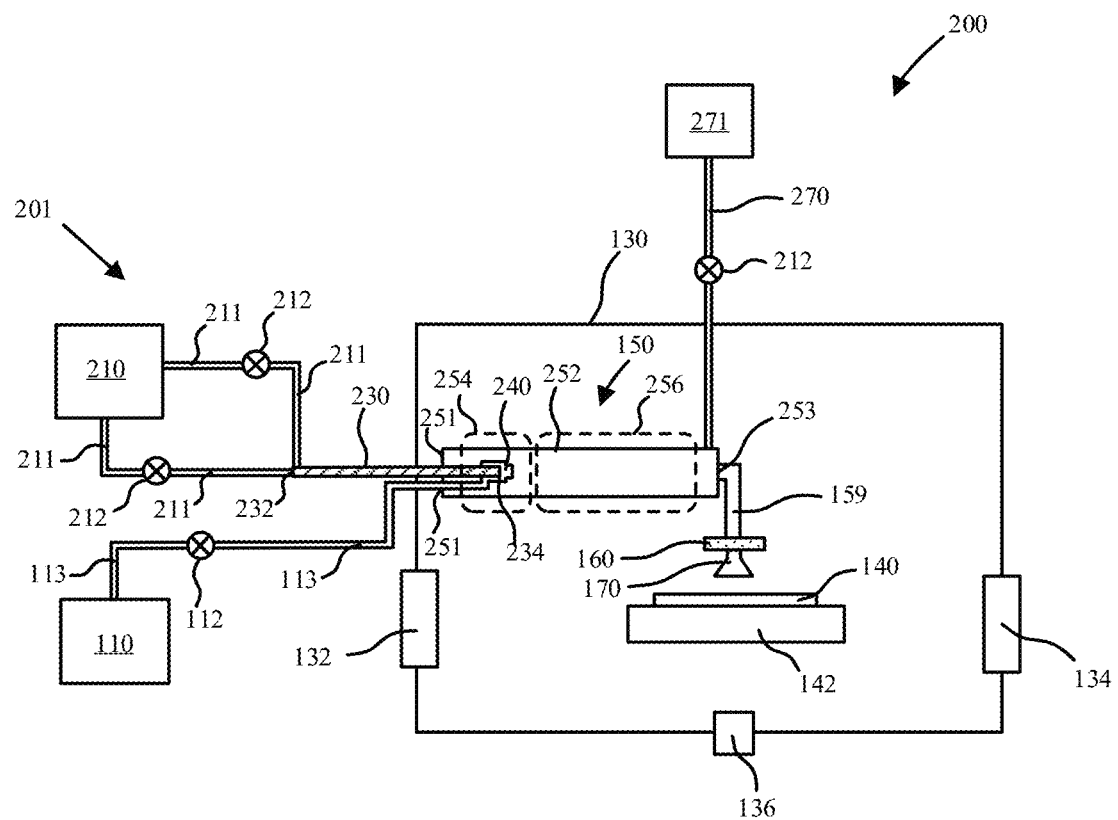
FIG. 5 is a schematic illustration of a VPT system in accordance with embodiments.

FIG. 4 is a flow diagram illustrating operation of a VPT system in accordance with an embodiment. FIG. 5 a schematic illustration is provided of a VPT system 200 in accordance with embodiments. In interest of conciseness, the method of operation and exemplary VPT system of FIGS. 4-5 are discussed concurrently. It is to be appreciated while the following description of FIGS. 4-5 is made with regard to a single source deposition method and system that the general system structure and processes can also be integrated with multiple source VPT systems and deposition methods.

At operation 4010 a carrier gas flow and a perovskite solution are combined to create an aerosolized perovskite solution. The perovskite solution may include an inorganic precursor and an organic precursor dissolved in one or more polar solvents such as N,N-Dimethylformamide (DMF), dimethyl sulfoxide (DMSO), N-methyl-2-pyrrolidone (NMP), acetonitrile, dimethylacetamide, or gamma-butyrolactone (GBL), or amine-based solvents.

In an exemplary single source solution embodiment, the perovskite solution includes at least one inorganic precursor selected from the group consisting of $PbI_2$, $SnI_2$, $PbBr_2$, $SnBr_2$, $PbCl_2$, $SnCl_2$, $SnF_2$, CsI, CsBr, CsCl, RbI, RbBr, RbCl, KI, KBr, and KCl, and the perovskite solution includes as least one organic halide organic precursor. For example, the organic halide can include one or more components selected from the group consisting of methylammonium iodide (MAI), formamidinium iodide (FAI), dimethylammonium iodide (DMA), phenethylammonium iodide, butylammonium iodide, and guanidinium iodide.

In a specific embodiment, the perovskite solution includes $PbI_2$, $SnI_2$, $SnF_2$, FAI, CsI for a low bandgap perovskite. In a specific embodiment, the perovskite solution includes $PbI_2$, $PbBr_2$, $PbCl_2$, CsI, FAI, DMAI for a wide bandgap perovskite.

In accordance with embodiments, the perovskite solution is optionally fed through a constricted channel 230 prior to combining the carrier gas flow and the perovskite solution, such that the perovskite solution does not prematurely evaporate. Surface tension within the constricted channel 230 may facilitate maintaining the perovskite solution in the liquid state, while the liquid front sees both a pressure and temperature differential between the inlet 232 (solution exposed to lower temperature, higher pressure) and outlet 234 (solution exposed to higher temperature, lower pressure). For example, the perovskite solution may see pressure differential of greater than 100 Torr between the inlet 232 of the constricted channel 230 and the outlet 234 of the constricted channel 230. The perovskite solution may also see a temperature differential of greater than 100° C. 200° C., 300° C., or more between the inlet 232 of the constricted channel 230 and the outlet 234 of the constricted channel 230. Furthermore, the perovskite solution may be flowing at a higher velocity at the outlet 234 of the constricted channel that at the inlet 232 of the constricted channel which can aid in flash evaporation. In embodiment, the perovskite solution is at approximately standard pressure at the inlet 232 of the constricted channel 230. For example, this may be the approximate pressure of the supply line 211. In an embodiment, a front of the perovskite solution is exposed to a pressure of less than 660 Torr at the outlet 234 of the constricted channel. In an embodiment the front of the perovskite solution is exposed to a pressure of 200 Torr or greater.

At operation 4020, the aerosolized perovskite solution is then vaporized in the vaporizer to form a constituent vapor. The vaporizer 150 illustrated in FIG. 5 includes a sub-chamber 252, such as a quartz tube, which includes one or more inlets 251 and outlet 253. Alumina, silicon carbide, or graphite tubes may also be used. The tube may be completely enclosed along its longitudinal length. For example, the tube may radially enclose the interior zone. Furthermore, ends of the tube may optionally be capped or exposed to vacuum from the vacuum chamber. As illustrated the gas inflow component inlet 251 and the liquid precursor supply component inlet 251 are located at a first end of the tube, and the outlet 253 is at a second end of the tube. The tube may see vacuum through the outlet 253 which is exposed to the vacuum chamber 130 pressure. Thus, in an embodiment the sub-chamber 252 is exposed to the vacuum chamber 130 pressure through an optional deposition head 170 (e.g. vapor nozzle). In such an embodiment, the sub-chamber ends may otherwise be capped creating a closed zone where the sub-chamber 252 is connected to the vacuum chamber 130 through deposition head 170. As illustrated, the vaporizer 150, including sub-chamber 252, is located inside the vacuum chamber 130. Though this is not strictly required, and the sub-chamber 252 may also be located outside the vacuum chamber 130 and still see the vacuum chamber pressure through the optional deposition head 170.

In an embodiment, the vaporizer maintains a high temperature vaporization zone above 400° C. The temperature of this zone may need to be greater than 400° C. if Cs is not a perovskite component and greater than 600° C. if the perovskite powder contains Cs. In an embodiment, the temperature is between 600-850° C. in order to facilitate the rapid vaporization of all the components of the perovskite solution. Higher temperatures may also be utilized to facilitate flash evaporation, such as approximately 800° C. The vaporizer may additionally, be maintained at a pressure of $10^{-4}$-100 Torr, or more specifically less than 10 Torr, such as $10^{-4}$-$10^{-2}$ Torr.

The sub-chamber 252, or quartz tube, may extend through one or more furnaces of the vaporizer 150 that correlate to one or more high temperature zones 254, 256, etc. In an embodiment, high temperature zone 254 is maintained at a lower temperature than high temperature zone 256. Such a configuration may expose the nozzle 243 to lower temperatures than those used for vaporization. For example, high temperature zone 254 may be an aspiration zone maintained at 200-500° C., while high temperature zone 256 corresponds to the high temperature vaporization zone maintained at greater than 400° C. if Cs is not a perovskite component, and greater than 600° C. if the perovskite solution contains Cs. In an embodiment, high temperature zone 256 is maintained at 600-850° C. in order to facilitate the rapid vaporization of all the components of the perovskite solution including the solvent, inorganic halides, and organic halides. In an embodiment, the high temperature zone 254 associated with the aspiration zone may optionally be actively cooled due to close proximity to the high temperature zone 256 maintained at a higher temperature.

In an embodiment, only a single high temperature zone 256 exists (high temperature zone 254 is removed). In such an embodiment, the nozzle 234 may be located in the high temperature zone 256. Other high temperature zone arrangements are possible in accordance with embodiments. Both the cooler and hotter temperature zones may be at a sufficient temperature above the vaporization temperatures to prevent condensation from any of the vapor phase constituents. The high temperature zones 254, 256 may be held at lower pressure (e.g. less than 50 Torr, and more specifically less than 10 Torr, such as $10^{-4}$-1 Torr) which helps increase the vapor pressure of the perovskite precursors and increase the evaporation rate. The carrier gas inflow and the constricted channel 230 may serve to create a pressure drop so that the perovskite solution need not be at as low of a pressure. The constituent vapor is then flowed through the vaporizer 150 to outlet 253, directed through a deposition head 170, and onto a target substrate 140. A supply line 159 and filter 160 may optionally be located between the outlet 253 and the deposition head 170. In accordance with embodiments, the outlet 253, supply line 159, filter 160 and deposition head 170 are all maintained at a sufficient minimum temperature to prevent condensation. For example, this may be 300° C. or higher (e.g. 300-450° C.) if Cs is not a perovskite component, and at least 400° C. (e.g. 400-650° C.) if the perovskite contains Cs. For perovskites with high Cs content, higher temperatures may be used, such as at least 500° C. Chamber 130 walls may likewise be maintained at the same temperatures to prevent condensation.

It is to be appreciated that while the above described embodiments vaporize the perovskite solution at low pressure, embodiments also envision vaporizing the perovskite solution or a perovskite precursor at higher pressure then feeding the constituent vapor or vaporized perovskite precursor into the low pressure regime through a mass flow controller 212. For example, a perovskite solution or perovskite precursor can be vaporized outsize at higher pressure outside of the vacuum chamber 130 and fed into the system with a supplemental gas source 271 via supply line 270. In accordance with embodiments, the supplemental constituent vapor or supplemental vaporized perovskite precursor can be combined with the vapor stream at various locations, such as being added to the vapor stream within the sub-chamber 252, before or after the filter 160, or along supply line 159, before or after the filter 160. This can also be used for feeding perovskite constituents in a multi-source VPT system.

In accordance with embodiments, and illustrated as operation 4030, the constituent vapor is flowed through the vaporizer and onto the target substrate. In accordance with embodiments, the constituent vapor is flowed through the vaporizer and onto the target substrate in less than two seconds, or more specifically less than 0.5 seconds. This includes all residency time of the constituent vapor within the vaporizer. This is not inclusive of residence time of the aerosolized perovskite solution within the vaporizer prior to being vaporized.

At operation 4040 the constituent vapor deposits on the target substrate 140 as a perovskite film. In an embodiment, the constituent vapor is first flowed through a filter 160 prior to depositing the perovskite film. The filter 160 may be provided at an exit of the vaporizer 150. For example, filter may be provided within the vaporizer, or outside the vaporizer. In an embodiment, the filter 160 is located within or at an end of the sub-chamber 252 (e.g. quartz tube). The vapor may then pass through a deposition head 170 (or vapor nozzle). In an embodiment, the deposition head 170 is an open end/outlet 253 of the sub-chamber 252. Alternatively, the deposition head 170 may be a separate component.

The vacuum chamber 130 may be designed with a symmetrical shape to control directionality of the vapor flow and the deposition profile. Furthermore, the deposition head 170

(e.g. deposition head, open end/outlet 253 of sub-chamber 252), substrate holder 142, and exhaust 136 (vacuum pump port) may be placed in alignment above each other in symmetrical shape so that the vapor is guided uniformly during deposition. The spacing between parts may be large enough so that the flow stays within the laminar or molecular flow regimes and does not induce any turbulent currents that could disturb a uniform deposition profile.

Filter 160 may be formed of a material(s) that does not corrode in acids or halogens at high temperature. In an embodiment, the filter is maintained at a temperature below the high temperature vaporization zone temperature. For example, the filter 160 may be maintained at a temperature of 300° C.-700° C., or more specifically greater than 300° C. if Cs is not a perovskite component, and at least 450° C. if the perovskite contains Cs. For perovskites with high Cs content, higher temperatures may be used, such as at least 500° C. Optional deposition head 170 may also be maintained at a similar temperature below the high temperature vaporization zone temperature.

The filter 160 may be designed to prevent contamination causing dust from passing though, while also not prolonging residency time of the perovskite in the vapor phase. The filter 160 may allow for laminar or molecular flow of the gas and vapor. In an embodiment, the filter is formed of a porous material such as a foam or mesh. For example, a mesh may include an interlaced or woven structure. In an embodiment, the filter 160 has a porosity of at least 50 pores per inch (pores/inch). Thickness may be a function of porosity, and may range from tens of micros to an inch, for example. In an embodiment, a filter 160 may include linear paths through its thickness. This may facilitate laminar or molecular flow and prevent turbulence.

The filter 160 in accordance with embodiments may be distinguishable from a conventional permeable member in several respects. As already described the vapor may have a larger mean free path through the filter 160. This may be accomplished by reducing thickness, increasing pore size, and/or filter type. For example, a mesh structure may have larger openings than a porous material typically used in a conventional permeable member. Furthermore, the filters 160 in accordance with embodiments may allow for laminar or molecular flow. Additionally, the filters 160 are not required to be tubular. Thus, rather than a radial diffusion surface, the filters 160 in accordance with embodiments can optionally have relatively two-dimensional filter surfaces (incoming and outgoing). Filter 160 may be formed of a material(s) that does not corrode in acids or halogens at high temperature. Exemplary materials include ceramics, carbon, silicon carbide, quartz, graphite, nickel-chromium-based alloys, and nichrome. A thermally conductive material may additionally mitigate vapor condensation on the filter.

In an embodiment, the filter 160 is formed of a foam with a porosity of at least 50 pores/inch. The foam may be formed of a variety of exemplary ceramics, carbon, silicon carbide, quartz, graphite, nickel-chromium-based alloys, and nichrome. In an embodiment, the filter 160 is a carbon foam. Filter 160 may also be similar to the permeable support 190 and bed of pellets 180 as described and illustrated with regard to FIG. 8.

In an embodiment, the filter 160 is formed of a metal alloy wire mesh. Such a wire mesh need not maintain strict spacing between wires. Thus, the wires may be evenly spaced, or less regularly spaced as in a cloth or brush. In an embodiment filter 160 is formed of wire cloth. Exemplary materials for the cloth include but are not limited to nichrome and nickel-chromium-based alloys. Each of the nickel-based superalloys can form a native thick passivating oxide which can prevent oxidation at high temperatures of approximately 800-900 C. The cloths may optionally be characterized by mesh size and wire size. Such a wire mesh or cloth may have a porosity of at least 50 pores/inch. For example, an exemplary mesh size may be 200 mesh or greater, such as 635 mesh. The filter may be fabricated by overlapping a plurality of sheets of wire mesh, which may have the effect of reducing opening size. In an embodiment, a stack of overlapped sheets of wire mesh is less than 500 microns thick.

In an embodiment, the filter is formed of a thin porous material (e.g. less than 200 microns, or more specifically less than 100 microns thick) or a mesh, where thickness may be greater (e.g. less than 500 microns, though it is possible to be thicker). For example, a mesh may include an interlaced or woven structure. In an embodiment, a mesh filter 160 may include linear paths through its thickness. This may facilitate laminar or molecular flow, and prevent turbulence.

In an embodiment, the filter does not require a porous material but is achieved by a baffled path for the vapor, in which non-vaporized material particles are held back by gravity before reaching the substrate. For example, a structure is formed of metal or ceramic and included in the vaporization zone or deposition head, which prevents the direct vapor flow towards the target substrate without first going through one or more changes of direction. Larger and heavier non-vaporized particles and debris get trapped by the baffled path.

The perovskite vapor is then optionally directed through a deposition head 170 onto a substrate which is cooled below 200° C., or more specifically below 100° C. If the substrate 140 is too hot, the perovskite will not deposit/stick as well. Note here that the substrate should be maintained above the vaporization temperature of the solvent(s) used to prevent the solvent(s) from precipitating onto the substrate and dissolving the perovskite film. In accordance with embodiments, the deposition head 170 and filter 160 do not need to be heated to as high of temperature as the vaporization zone inside the vaporizer; they must be heated just hot enough for the perovskite vapor to not stick, which may be above approximately 450° C. for Cs containing perovskites and above 300° C. for perovskites not containing Cs.

In an embodiment, in order to prevent the degradation of the organic cation, this process occurs at lower pressure (e.g. less than 10 Torr, and more specifically $10^{-4}$-1 Torr) and the constituent vapor travels through the high temperature vaporization zone to the substrate in less than two seconds, or more specifically less than 0.5 seconds. Residence time in the vapor phase can depend on a combination of process parameters, including temperature, pressure, and concentration. These parameters can be tuned to decrease the extent of reaction or degradation of the organic components in particular. Disturbances in the flow due to eddies caused by turbulence or filtration can increase the residence time of some portion of the constituent perovskite constituent vapor, leading to the potential for a higher proportion of the organic constituents undergoing thermal degradation.

In an exemplary implementation, the carrier gas (e.g. nitrogen) flows through the vaporizer at an elevated temperature (for example only, it may be assumed the carrier gas is at least 700° C. when flowed through a vaporizer maintained at 850° C., though the high temperature zones for the vaporizer may be at lower temperatures than this example). At such high temperature, the nitrogen will have expanded significantly, increasing the flow velocity into the m/s range even for larger diameter transfer tubing. At such a flow rate, the constituent vapor can travel through the vaporizer, as well as to the target substrate in less than two seconds unless it experiences flow disruption in the form of eddies (caused by turbulent flow) or filtration. In accordance with embodiments, additional turbulent flow is not necessary since the perovskite precursors can be added to the perovskite solution at desired concentrations. Such a process flow differs significantly from a conventional VTD system in which turbulence is intentionally created in the vaporization zone to mix the precursors.

In accordance with embodiments, distance of the vapor source exit to the target substrate 140 can be adjusted for the characteristic vapor stream. For example, sub-chamber (e.g. quartz tube) 252 outlet 253, deposition head 170 exit, or mixing nozzle exit may be located at a shorter distance to the target substrate 140 (e.g. less than 4 cm) for laminar flow (e.g. at chamber pressures of 0.1-10 Torr), and greater than 4 cm for molecular flow (e.g. at chamber pressures of $10^{-4}$ Torr-0.1 Torr, such as $10^{-4}$-$10^{-2}$ Torr). It is to be appreciated that the +/−4 cm distance is exemplary, and embodiments are not so limited.

Figure 6:
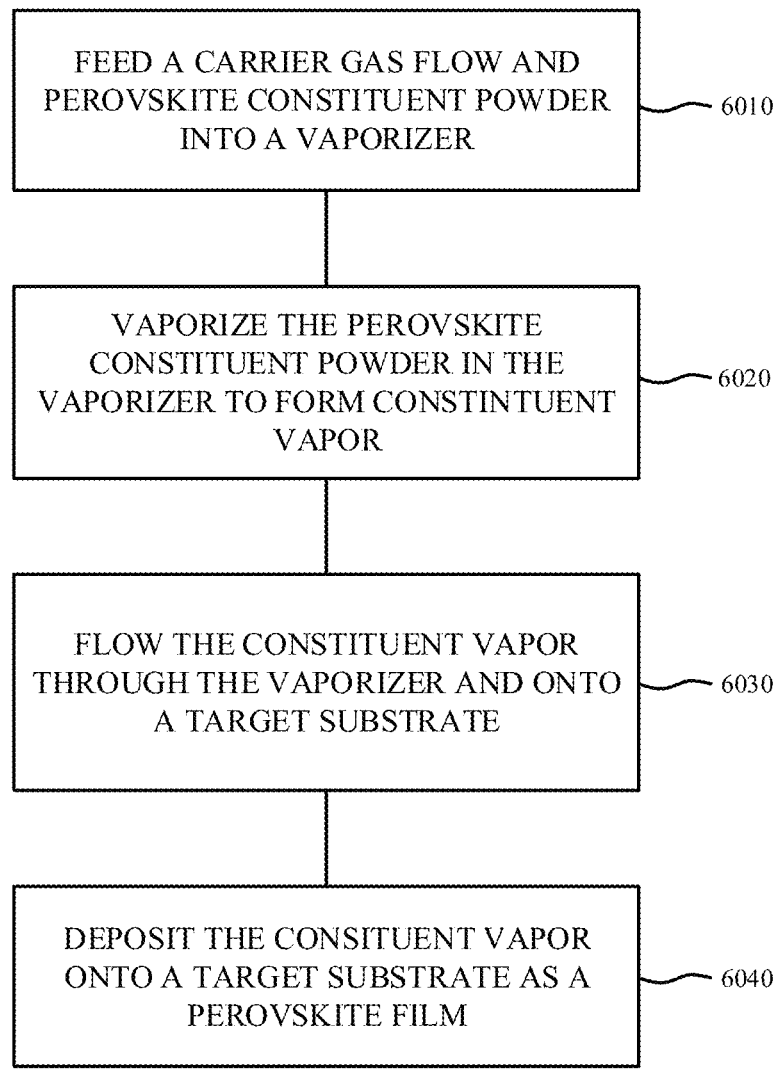
FIG. 6 is a flow diagram illustrating operation of a VPT system in accordance with an embodiment.
Figure 7:
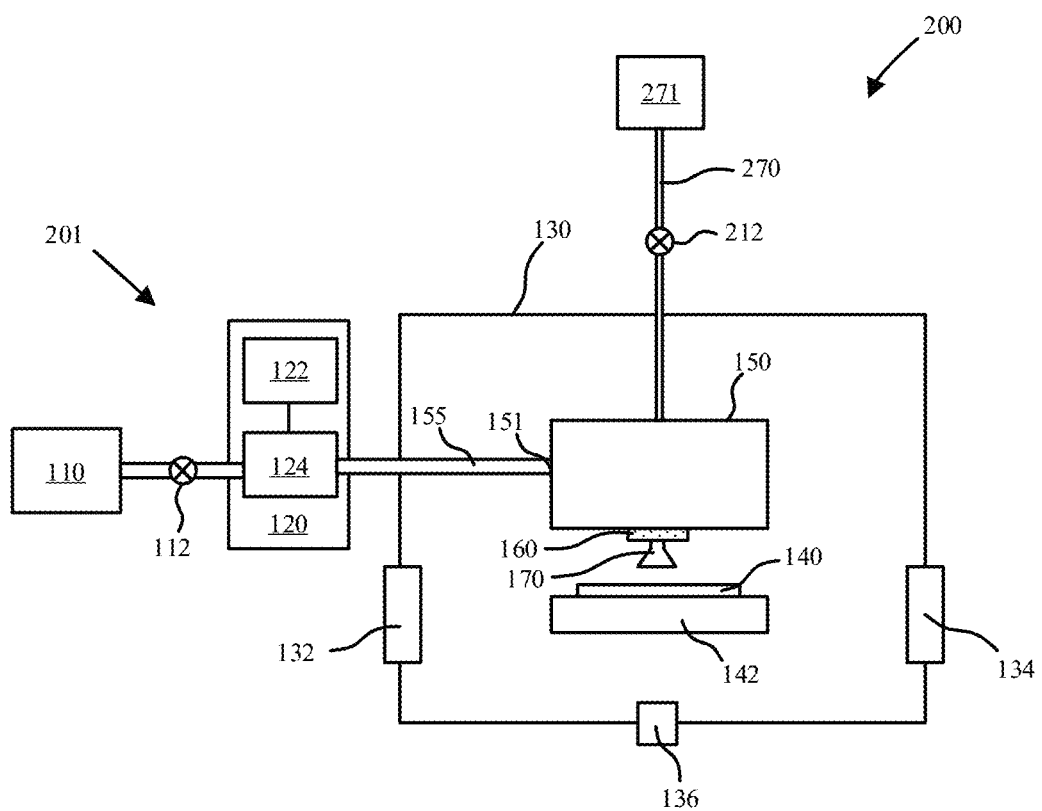
FIG. 7 is a schematic illustration of a VPT system in accordance with embodiments.

Referring now to FIGS. 6-7, FIG. 6 is a flow diagram illustrating operation of a VPT system in accordance with an embodiment. FIG. 7 a schematic illustration is provided of a VPT system 200 in accordance with embodiments. In interest of conciseness, the method of operation and exemplary VPT system of FIGS. 6-7 are discussed concurrently. It is to be appreciated while the following description of FIGS. 6-7 is made with regard to a single source deposition method and system that the general system structure and processes can also be integrated with multiple source VPT systems and deposition methods.

At operation 6010 a carrier gas, such as nitrogen, argon, or helium, and perovskite constituent powder are fed into a vaporizer, for example, using a solid precursor supply assembly 201 such as that described and illustrated with regard to FIG. 2. In accordance with embodiments, the perovskite constituent powder may include a perovskite powder, or a mixture of an inorganic precursor powder and an organic precursor powder.

In an embodiment, an inorganic constituent powder includes at least one inorganic powder selected from the group consisting of $PbI_2$, $SnI_2$, $PbBr_2$, $SnBr_2$, $PbCl_2$, $SnCl_2$, $SnF_2$, CsI, CsBr, CsCl, RbI, RbBr, RbCl, KI, KBr, and KCl. The inorganic precursor powder may include an alloy powder, such as a lead-tin-halide alloy precursor powder.

In an embodiment, the organic precursor powder includes an organic halide powder. For example, the organic halide powder can include one or more materials selected from the group consisting of methylammonium iodide (MAI), formamidinium iodide (FAI), dimethylammonium iodide (DMA), phenethylammonium iodide, butylammonium iodide, and guanidinium iodide.

In a specific embodiment, the perovskite constituent powder includes a mixture of $PbI_2$, $SnI_2$, $SnF_2$, FAI, CsI for a low bandgap perovskite. In a specific embodiment, the perovskite constituent powder includes a mixture of $PbI_2$, $PbBr_2$, $PbCl_2$, CsI, FAI, DMAI for a wide bandgap perovskite.

The constituent powder and carrier gas will then flow into the vaporizer 150 where it will be rapidly vaporized at operation 6020. The temperature of this zone may need to be greater than 500° C. if Cs is not a perovskite component and greater than 650° C. if the perovskite powder contains Cs. In an embodiment, the temperature is between 650-850° C. in order to facilitate the rapid vaporization of the perovskite powder. Higher temperatures may also be utilized to facilitate flash evaporation, such as approximately 1,000° C.

Particle precursors may also warrant higher temperature than solution precursors, as larger particles may take longer to vaporize. Smaller particle diameters achieved with longer ball-milling times may be utilized because they evaporate more quickly and require lower vaporization temperatures. For example, the constituent powders may have a 95% particle size less than 1 mm, or more specifically a 95% particle size less than 100 μm, though this is not necessarily required. In an embodiment, in order to prevent the degradation of the organic cation, this process occurs at lower pressure (e.g. less than 100 Torr, or more specifically less than 10 Torr, such as $10^{-4}$-1 Torr, or $10^{-4}$-$10^{-2}$ Torr) and the perovskite vapor constituent travels through the vaporizer 150 to the substrate 140.

In accordance with embodiments, and illustrated as operation 6030, the constituent vapor is flowed through the vaporizer and onto the target substrate. In accordance with embodiments, the constituent vapor is flowed through the vaporizer and onto the target substrate in less than two seconds, or more specifically less than 0.5 seconds. This includes all residency time of the constituent vapor within the vaporizer. This is not inclusive of residence time of the perovskite constituent powder within the vaporizer prior to being vaporized. Notably, the continuous or semi-continuous feed of the powder into the vaporizer is used to limit high temperature exposure time of the organics, and prevent decomposition.

Residence time in the vapor phase case depend on a combination of process parameters, including temperature, pressure, concentration, and particle size. These parameters can be tuned to decrease the extent of reaction or degradation of the organic components in particular. Disturbances in the flow due to eddies caused by turbulence or filtration can increase the residence time of some portion of the constituent perovskite vapor, leading to the potential for a higher proportion of the organic constituents undergoing thermal degradation.

In an exemplary implementation, the carrier gas (e.g. nitrogen) flows through the vaporizer at an elevated temperature (for example, it can be safely assumed the carrier gas is at least 700° C. when flowed through a vaporizer maintained at 850° C.). At such high temperature, the nitrogen will have expanded significantly, increasing the flow velocity into the m/s range even for larger diameter transfer tubing. At such a flow rate, the constituent vapor can travel through the vaporizer, as well as to the target substrate in under 2 seconds, or more specifically less than 0.5 seconds such as 0.01 seconds, unless it experiences flow disruption in the form of eddies (caused by turbulent flow) or filtration. In accordance with embodiments, additional turbulent flow is not necessary since the constituent powders can be pre-mixed (e.g. by ball milling) at desired concentrations. Such a process flow differs significantly from a conventional VTD system in which turbulence is intentionally created in the vaporization zone to mix the precursors upstream and at higher pressures.

In accordance with embodiments, the vaporizer 150 may include a single temperature zone or multiple temperature zones. For example, the powder may enter the vaporizer 150 in a cooler temperature zone, then flow into a hot temperature zone (e.g. 850° C.). Alternatively, the vaporizer may only include a hot temperature zone. Both the cooler and hot temperature zones may be at a sufficient temperature above the sublimation temperatures to prevent condensation from any of the vapor phase constituents.

At operation 6040 the constituent vapor deposits on the target substrate as a perovskite film. In an embodiment, the constituent vapor is first flowed through a filter 160 prior to depositing the perovskite film. The filter 160 may be provided at an exit of the vaporizer 150, or within the vaporizer (e.g. as part of sub-chamber 252 as previously described with regard to FIG. 5). In an embodiment, the filter is maintained at a temperature below the high temperature vaporization zone temperature. For example, the filter 160 may be maintained at a temperature of 650° C.-1,000° C., or more specifically 800° C. Optional nozzle 170 may also be maintained at a similar temperature below the high temperature vaporization zone temperature. Similar to the discussion with regard to FIG. 5, the nozzle may correspond to an open end/outlet 253 of sub-chamber 252 (e.g. quartz tube) or be a separate component.

In an embodiment the nozzle 170 is be maintained above 500° C. and the substrate is cooled below 200° C., or more specifically below 150° C. If the substrate 140 is too hot, the perovskite will not deposit/stick as well. In accordance with embodiments, the optional nozzle 170 and filter 160 do not need to be heated to as high of temperature as the vaporization zone inside the vaporizer; they must be heated just hot enough for the perovskite vapor to not stick, which may be approximately above 650° C. for Cs containing perovskites and above 500° C. for perovskites not containing Cs.

It is to be appreciated that while the above described embodiments vaporize the perovskite constituent powder at low pressure, embodiments also envision vaporizing the perovskite constituents or a perovskite precursor at higher pressure then feeding the constituent vapor or vaporized perovskite precursor into the low pressure regime through a mass flow controller 212. For example, a perovskite constituent or perovskite precursor can be vaporized outsize at higher pressure outside of the vacuum chamber 130 and fed into the system with a supplemental gas source 271 via supply line 270. In accordance with embodiments, the supplemental constituent vapor or supplemental vaporized perovskite precursor can be combined with the vapor stream at various locations, such as being added to the vapor stream within the sub-chamber 252, before or after the filter 160, or along supply line 159, before or after the filter 160. This can also be used for feeding perovskite constituents in a multi-source VTD system.

In accordance with embodiments, distance of the vapor source exit to the target substrate 140 can be adjusted for the characteristic vapor stream. For example, sub-chamber (e.g. quartz tube) 252 outlet 253, deposition head 170 exit, or mixing nozzle exit may be located at a shorter distance to the target substrate 140 (e.g. less than 4 cm) for laminar flow (e.g. at chamber pressures of 0.1-10 Torr), and greater than 4 cm for molecular flow (e.g. at chamber pressures of $10^{-4}$ Torr-0.1 Torr, such as $10^{-4}$-$10^{-2}$ Torr). It is to be appreciated that the +/−4 cm distance is exemplary, and embodiments are not so limited.

Figure 8:
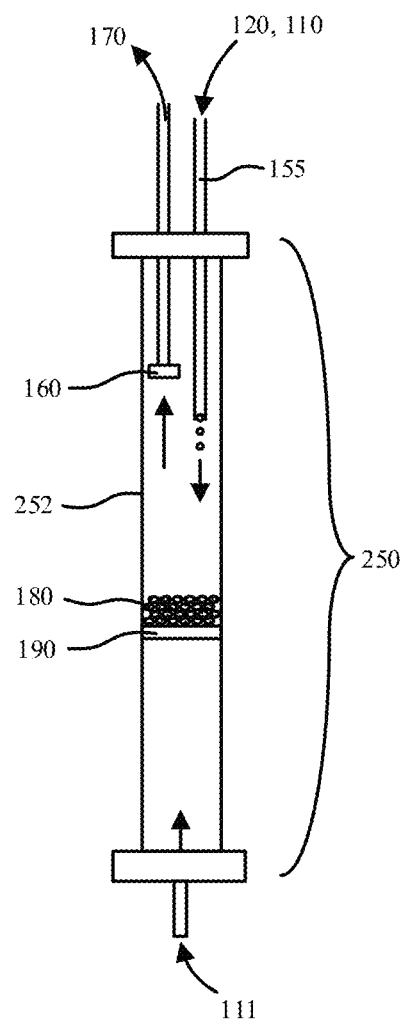
FIG. 8 is a close-up schematic illustration of material flow through a vaporizer in accordance with an embodiment.

Referring now to FIG. 8, a close-up schematic illustration is provided of material flow through a vaporizer in accordance with an embodiment. The particular material flow and arrangement of FIG. 8 may additionally be compatible with powder feeding systems such as at least the system illustrated in FIG. 7. In the particular arrangement illustrated in FIG. 8, gravity may be utilized to facilitate either or both filtering and feeding of the constituent powder. In particular, the vaporizer 150 of FIG. 8 illustrates a fluidized bed feeding concept. In an embodiment, the constituent powder is optionally diluted with a ceramic/inert filler (such as powder, pellets, beads). For example, the filler powder can be added to assist the perovskite precursor powder in flowing more freely through the powder feeder and preventing the perovskite powder from sticking and compacting. Pellets and beads, with a 0.5-5 mm diameter or maximum width, may also be used which the perovskite powder is lightly adhered to via previously coating or ball-milling. For example, the constituent powder can be mixed with SiC, alumina, or silica filler. In an embodiment, the constituent powder is mixed with SiC filler due to high thermal conductivity. The constituent powder (optionally blended with ceramic/inert filler) can be fed into the vaporizer though supply line 155 against a hot stream of carrier gas from carrier gas source 111. For example, carrier gas sources 110, 111 may supply the same carrier gas (e.g. nitrogen).

In operation, the blended constituent powder falls down onto a bed of pellets 180 on a permeable support 190. The carrier gas from carrier gas source 111 may flow through the permeable support 190 and bed of pellets 180 at the vaporization temperature (e.g. 850-900° C.). In such an arrangement, the constituent powder can be carried into the vaporizer 150 with the carrier gas from carrier gas source 110, which can optionally be aided by gravity. The upward carrier gas stream from carrier gas source 111 may not be strong enough to push the constituent powder upwards. Thus, the constituent powder may partially vaporize when falling into the vaporizer 150. The constituent powder may be fully and rapidly vaporized when it falls down onto the bed of pellets 180 maintained at high temperature. Pellets 180 may be formed of a thermally conductive material (e.g. SiC) and have larger width/diameter (e.g. 1 mm) compared to the constituent powder. Permeable support may be formed similarly as filter 160. For example, the permeable support may be a nichrome/Inconel mesh filter.

Once vaporized, the constituent vapor exits the vaporizer 150 toward nozzle 170. The constituent vapor may optionally pass through a filter 160 as previously described. In such an arrangement, gravity may facilitate filtering of dust or non-vaporized particles from passing to the nozzle 170. Thus, filtering requirements of the filter 160 can potentially be mitigated or removed, which may additionally facilitate mass flow. Gravity may additionally be utilized to feed the constituent powder into the vaporizer 150, which can facilitate a continuous feed rate.

Figure 9:
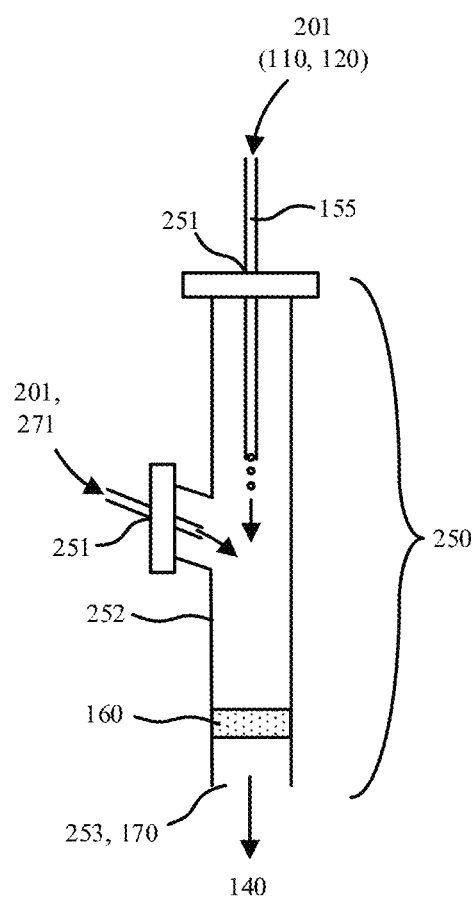
FIG. 9 is a close-up schematic illustration of material flow through a vaporizer in accordance with an embodiment.

FIG. 9 is a close-up schematic illustration of material flow through a vaporizer in accordance with an embodiment. The particular material flow and arrangement of FIG. 9 may additionally be compatible with powder feeding systems such as at least the system illustrated in FIG. 7. Similar to FIG. 8, a powder precursory supply assembly 201 can supply the constituent powder, which can also be aided by gravity. In the particular embodiment illustrated, a filter 160 is provided with the vaporizer 250, for example, within the sub-assembly 252, such as a quartz tube. The filter 160 may be similar to any of the previous filters 160 described, including the combination of the bed of pellets 180 on a permeable support 190 of FIG. 8. In the embodiment illustrated, nozzle 170 may correspond to an open end/outlet 253 of the sub-chamber 252, though a separate nozzle 170 may be provided.

In the illustrated embodiment, the sub-chamber 252 may include one or more inlets 251. For example, one or more additional inlets 251 can be connected to a second precursory supply assembly 201, or a supplemental gas source 271 and supply line 270 which can optionally provide supplemental vaporized perovskite precursor. For example, an organic precursor can be bled into the vapor stream with the supplemental gas source 271. As such, the supplemental organic perovskite precursor can be vaporized at higher pressure, before being added to the vapor stream within the sub-chamber 252. Location of the additional inlets 251 can also be variable. For example, these can be provided before or after the filter 160. In the particular embodiment illustrated in FIG. 9, the sub-chamber 252 may be T-shaped or Y-shaped, though other configurations are possible.

Similar to the discussion of FIG. 8, the perovskite constituent powder in FIG. 9 may be optionally diluted with a ceramic/inert filler (such as powder, pellets, beads). For example, filler powder, pellets, beads may have a 0.5-5 mm diameter or maximum width may also be used. Addition of inert filler can be utilized in any powder source described herein, particularly when utilizing the vaporizer 250 of FIG. 9 in a multi-source VTD system.

In accordance with embodiments, the vaporizer 250 of FIG. 9 may include one or a plurality of temperature and vaporization zones. For example, each arm of the sub-chamber 252 (e.g. extending from a fork to inlet 251) can be maintained at a different temperature depending upon material being fed. Additionally, the filter 160 may be maintained at a different temperature zone. Each arm, whether maintained at a different or same temperature may be considered a separate vaporization zone depending upon the materials system, and whether vaporization is occurring in the specified region.

In an embodiment filter 160 may have substantially two-dimensional filter surfaces (incoming and outgoing). For example, this may be attributed to the filter being secured within and spanning across/filling/filtering the vapor path within a sub-chamber 252 such as quartz tube. In an embodiment, the filter 160 is a foam, such as a carbon foam with a porosity of greater than 50 pores/inch.

Figure 10:
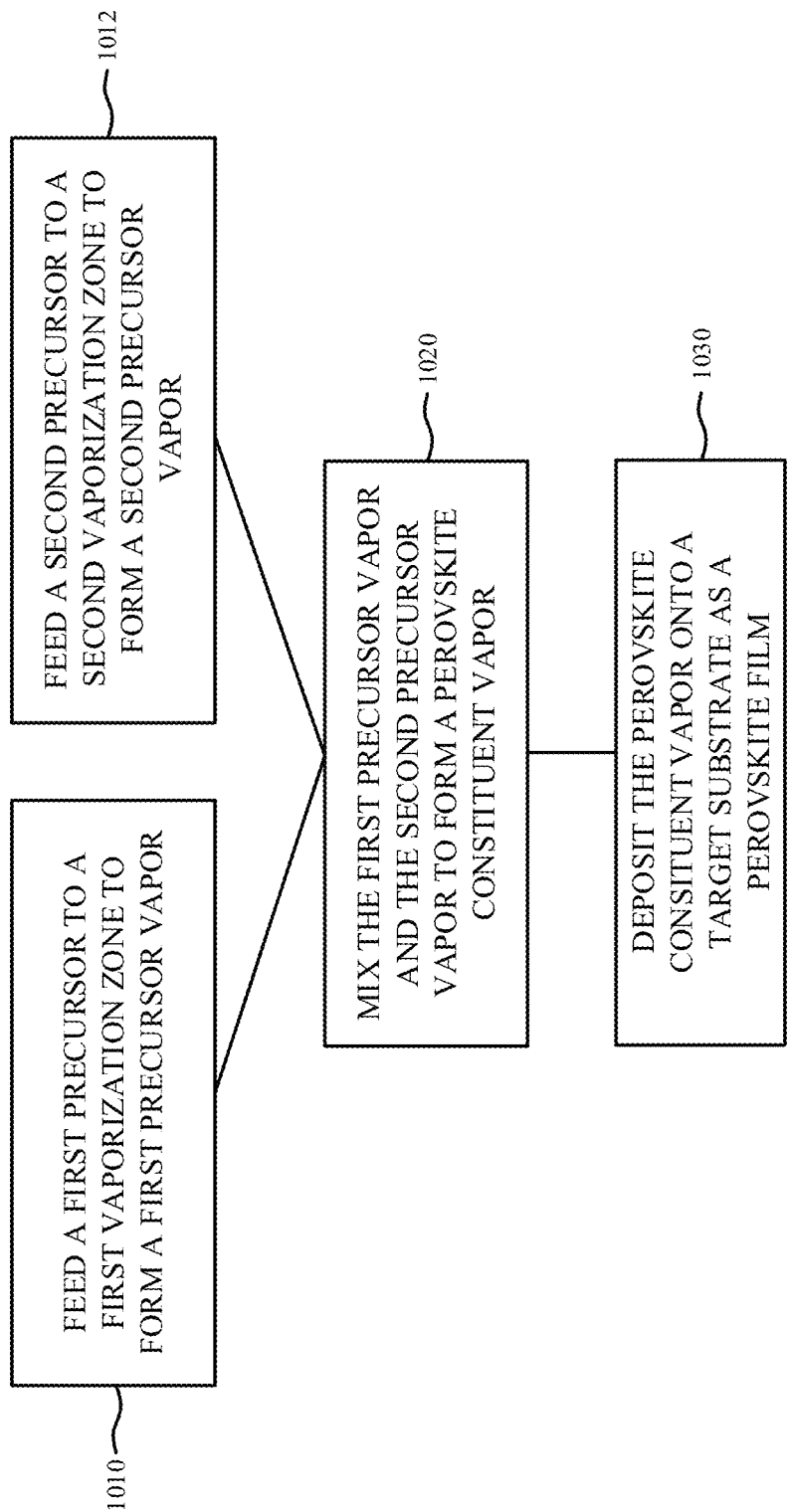
FIG. 10 is a flow diagram illustrating operation of a VPT system in accordance with an embodiment.

FIG. 10 is a flow diagram illustrating operation of a multiple source VTD system in accordance with an embodiment. In the following discussion of the VTD method of FIG. 10 reference is made generally to all VTD systems described herein, including FIGS. 11-16 not previously described.

At operation 1010 a first precursor is fed to a first vaporization zone (e.g. a first vaporizer 250A, or temperature zone of a vaporizer) to form a first precursor vapor. At operation 1012 a second precursor is fed to a second vaporization zone (e.g. a second vaporizer 250B, or separate or same temperature zone of a same vaporizer) to form a second precursor vapor. The first precursor vapor and the second precursor vapor are then mixed at operation 1020 to form a constituent vapor, and the constituent vapor is then deposited as a perovskite film on a target substrate 140 at operation 1030. In some embodiments, the second precursor vapor in the second vaporization zone (e.g. vaporizer 250B) is at a higher temperature that the first precursor vapor in the first vaporization zone (e.g. vaporizer 250A), and the constituent vapor (e.g. within an optional mixer 300 or supply line 270) is at a higher temperature than the first precursor vapor in the first vaporization zone. In an embodiment, a first and second vaporization zones (e.g. vaporizers 250A, 250B) are in-line, such that the first precursor vapor flows into the second vaporization zone (e.g. second vaporizer 250B) and through the second vaporization zone. In an embodiment, the first and second vaporization zones (e.g. vaporizers 250A, 250B) are in-line such that they are sequentially fed into a supply line 270 with a supplemental carrier gas. A variety of arrangements are possible as previously described. Furthermore, the first and second vaporization zones can be different locations with in a same vaporizer, or sub-chamber.

In some embodiments, a combination of liquid and solid precursors may be used. For example, feeding the first precursor to the first vaporization zone (e.g. first vaporizer 250A) to form the first precursor vapor may include combining a first carrier gas flow and a perovskite precursor solution to create an aerosolized perovskite precursor solution, and feeding the second precursor to the second vaporization zone (e.g. vaporizer 250B) may include feeding a second carrier gas flow and a perovskite precursor powder into the second vaporization zone (e.g. vaporizer 250B) and vaporizing the perovskite precursor powder in the second vaporization zone.

Residency time in the vapor phase may also be minimized. For example, the first precursor vapor can be flowed through the first vaporization zone (e.g. first vaporizer 250A) and onto the target substrate 140 in less than two seconds, or more specifically less than 0.5 seconds. Other precursor vapors may similarly flow the system in less than two seconds, or more specifically less than 0.5 seconds.

In accordance with embodiments, distance of the vapor source exit to the target substrate 140 can be adjusted for the characteristic vapor stream. For example, sub-chamber (e.g. quartz tube) 252 outlet 253, deposition head 170 exit, or mixing nozzle exit may be located at a shorter distance to the target substrate 140 (e.g. less than 4 cm) for laminar flow (e.g. at chamber pressures of 0.1-10 Torr), and greater than 4 cm for molecular flow (e.g. at chamber pressures of $10^{-4}$ Torr-0.1 Torr, such as $10^{-4}$-$10^{-2}$ Torr). It is to be appreciated that the +/−4 cm distance is exemplary, and embodiments are not so limited.

In interest of clarity, in the following description and illustration of FIGS. 11-16, vaporizers are illustrated as separate components with separate temperature zones. Practically speaking, separate vaporizers may include separate sub-chambers 252 with their own corresponding vaporization zones (where vaporization occurs). Likewise, the separately illustrated vaporizers can be understood to also be illustrative of separate vaporization zones (where separate vaporization occurs) within a single vaporizer. For example, each separate vaporization zone may correspond to a different location (e.g. arm) of a sub-chamber 252, possibly with a different temperature zone, though each different location can also be within a same temperature zone. Likewise, the supply line 270 may be a separate structure (e.g. sub-chamber) or be a part of the sub-chamber(s) for the various vaporizer(s) to which it is connected.

Figure 11:
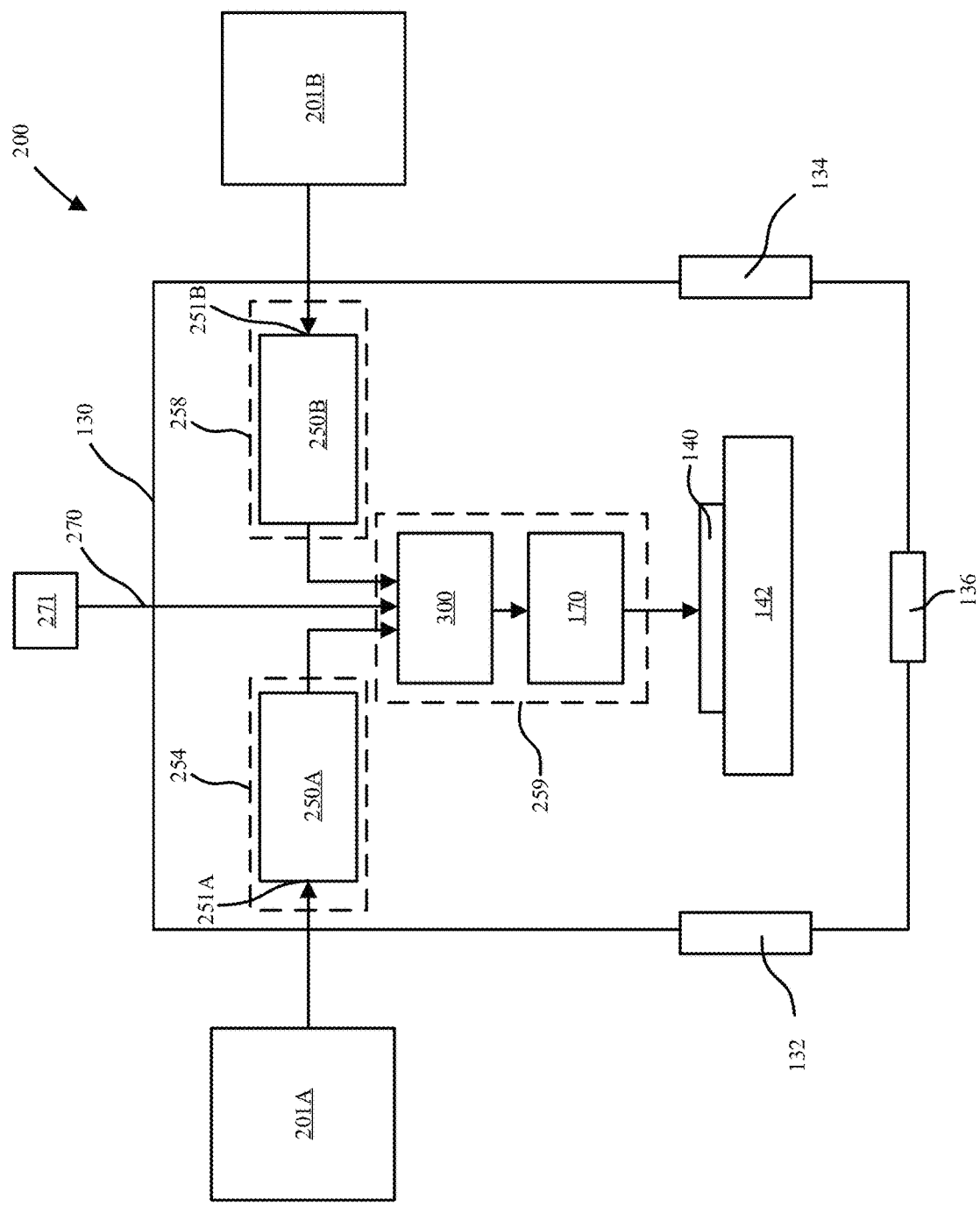
FIG. 11 is a schematic illustration of a VPT system with separate vaporizers in accordance with embodiments.

Referring now to FIG. 11 a schematic illustration is provided of a VTD system 200 with separate vaporizers in accordance with embodiments. As shown, there is a vacuum chamber 130, a first vaporizer 250A (which can hereinafter also be understood as a first vaporization zone) coupled with the vacuum chamber 130, a first precursor supply assembly 201A coupled with an inlet 251A of the first vaporizer 250A, a second vaporizer 250B (which can hereinafter also be understood as a second vaporization zone), and a second precursor supply assembly 201B coupled with an inlet 251B of the second vaporizer 250B. A deposition head 170 is optionally coupled downstream of the first vaporizer 250A and the second vaporizer 250B. The deposition head 170 can be separate component or open outlet 253 of a sub-chamber 252 as previously described or a separate component. A substrate holder 142 is positionable adjacent the deposition head 170. In an embodiment, a mixer 300 can be located between the vaporizers 250A, 250B and the deposition head 170 to facilitate mixing of the precursor vapors. In an embodiment, the mixer 300, and optionally the deposition head 170 are part a mixing nozzle.

The mixer 300 in accordance with embodiments is optional, and may not be necessary to mix the perovskite precursors. For example, sufficient mixing may be achieved by combining fluid streams, either as separate fluid streams or in an in-line manner. Mixing may also occur at the substrate 140 surface, particularly at lower pressures (e.g. less than 0.1 Torr) where the vapor flux towards the substrate no longer follows laminar flow lines and is in the molecular flow or Stokes flow regime. A supplemental carrier gas can optionally be supplied from supplemental gas source 271 via supply line 270 in accordance with embodiments. Supplemental vaporized perovskite precursor can be provided with the supplement carrier gas. For example, an organic precursor can be bled into the vapor stream with the supplemental gas source 271. As such, the supplemental organic perovskite precursor can be vaporized at higher pressure, before being added to the vapor stream. The optional supply line 270 and supplemental carrier gas may be maintained at an elevated temperature, for example, of at least elevated temperature zone 259. The fluid streams from vaporizers 250A, 250B may each be fed into the supplemental carrier gas stream in supply line 270, or all fluid streams can be separately supplied to the mixer 300.

The vacuum chamber 130 may be designed with a symmetrical shape to control directionality of the vapor flow and the deposition profile. Furthermore, the deposition head 170, substrate holder 142, and exhaust 136 (vacuum pump port) may be placed in alignment above each other in symmetrical shape so that the vapor is guided uniformly during deposition. The spacing between parts may be large enough so that the flow stays within the laminar or molecular flow regimes and does not induce any turbulent currents that could disturb a uniform deposition profile.

In accordance with embodiments, the first precursor supply assembly 201A and the second precursor supply assembly 201B can supply different perovskite precursors. In the following description, each precursor supply assembly 201, 201B, 201C, etc. may correspond to any of the precursor assemblies 201 (e.g. power, solution, vapor) described herein. In accordance with embodiments, each precursor can have its own precursor supply assembly. While two precursor supply assemblies are illustrated, more may be included in a variety of separate fluid streams or in-line fluid streams, and combinations thereof. The separately fed precursors may be fed into separate vaporizers or shared vaporizers. For convenience, the precursors may be grouped (mixed) in precursor supply assemblies based on material vapor pressures and degradation. In an embodiment, organic precursors can be supplied by precursor supply assembly 201A, with inorganic precursors supplied by precursor supply assembly 201B.

In an embodiment, the first vaporizer 250A maintains a cooler temperature zone 254, and the second vaporizer 250B maintains a high temperature zone 258. For example, a cooler temperature zone 254 may be 100-450° C., or more specifically 150-250° C., sufficient to vaporize the organic halides. Each organic halide may have its own feeder and vaporization zone, or share them. In interests of conciseness, the VTD system 200 illustrated in FIG. 2 shows a shared first precursor supply assembly 201A and first vaporizer 250A for the organic precursor(s). Alternatively, multiple organic precursors may be separately fed into a same vaporizer or separate vaporizers in separate fluid streams or an in-line fluid stream. The high temperature zone 258 may be maintained at 450-1,000° C. More specifically, the high temperature zone 258 may be maintained at greater than 400° C. if Cs is not a perovskite precursor component, and greater than 600° C. if the perovskite precursor contains Cs. In an embodiment, high temperature zone 258 is maintained at 600-750° C. in order to facilitate the rapid vaporization of all the inorganic halides including metal halides and alkali halides.

In an embodiment, the first vaporizer 250A is utilized to supplement an organic precursor. For example, this may occur where the second vaporizer 250B is utilized to additionally the organic and inorganic precursors. Alternatively, or additionally, organic precursors can be supplied with the supplemental gas supply 271, and supply line 270 maintained at similarly lower temperatures as the first vaporizer 250A. In the illustrated configuration, the high temperature zone 258 and second vaporizer can flash the perovskite organic and inorganic precursors, which can be supplied together in a powder mixture, for example. The first vaporizer 250A, and optional supplemental gas supply may be used to tune the system due to some amount of organic precursor degradation in the system.

Once vaporized, the precursor vapors flow downstream to an optional mixer 300 and optional deposition head 170, also maintained at an elevated temperature zone 259. In mixer 300 the precursor vapors are mixed to form a perovskite constituent vapor, which is then passed through the deposition head 170 and deposited as a perovskite film on target substrate 140. Alternatively, the precursor vapors can be fed into a supply line 270 where they are mixed with a supplemental carrier gas flow. Upon mixing, the constituent vapor will be at a temperature above the lowest precursor vapor temperature. In accordance with embodiments, the constituent vapor in elevated temperature zone 259 need be at high enough of a temperature for the perovskite vapor to not stick, which may be above approximately 450° C. for Cs containing perovskites and above 300° C. for perovskites not containing Cs. The substrate 140 may be cooled below 200° C., or more specifically below 150° C. If the substrate 140 is too hot, the perovskite will not deposit/stick as well.

Figure 12A:
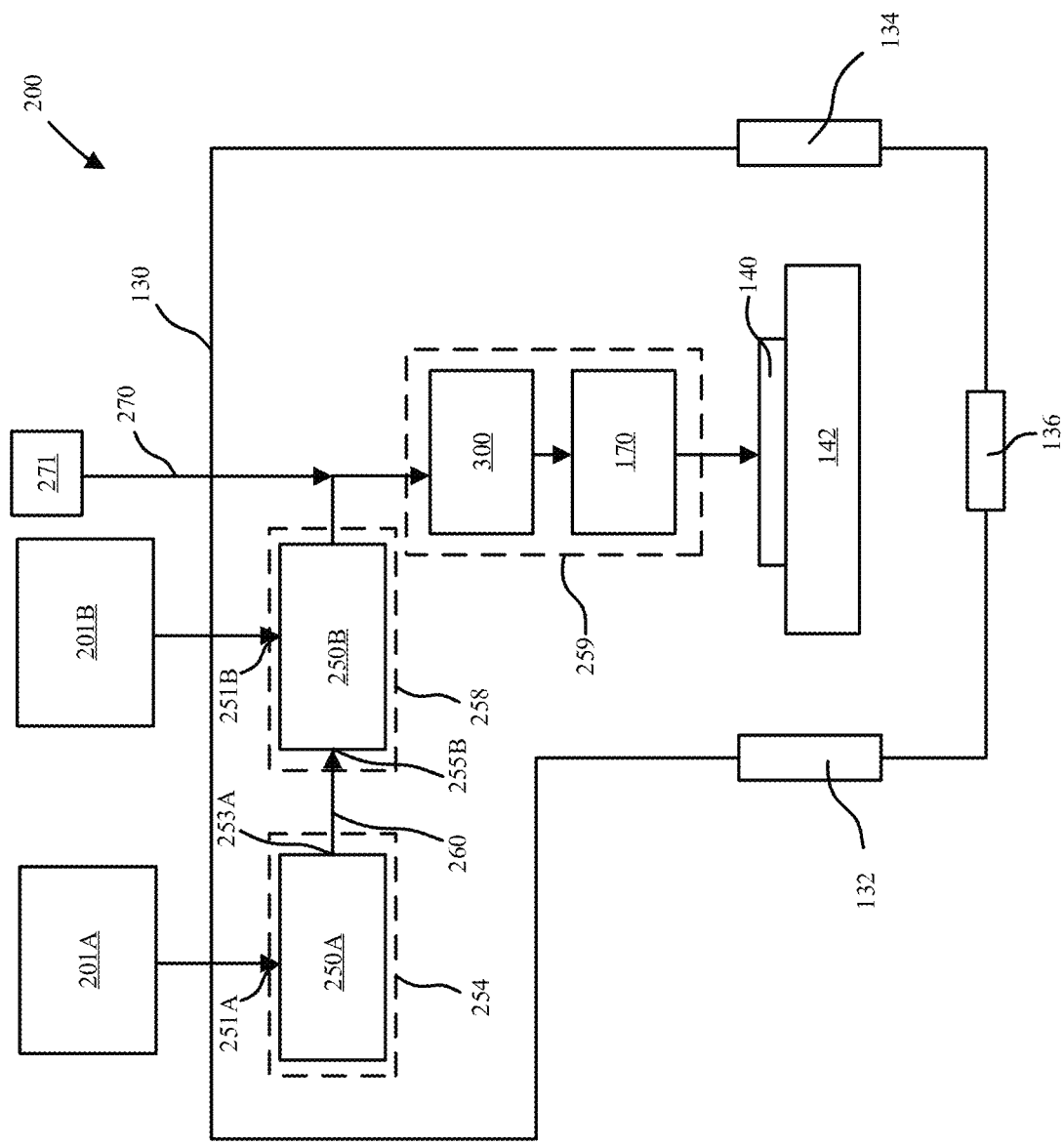
FIGS. 12A and 13A are schematic illustrations of VPT systems with in-line vaporization in accordance with embodiments.
Figure 12B:
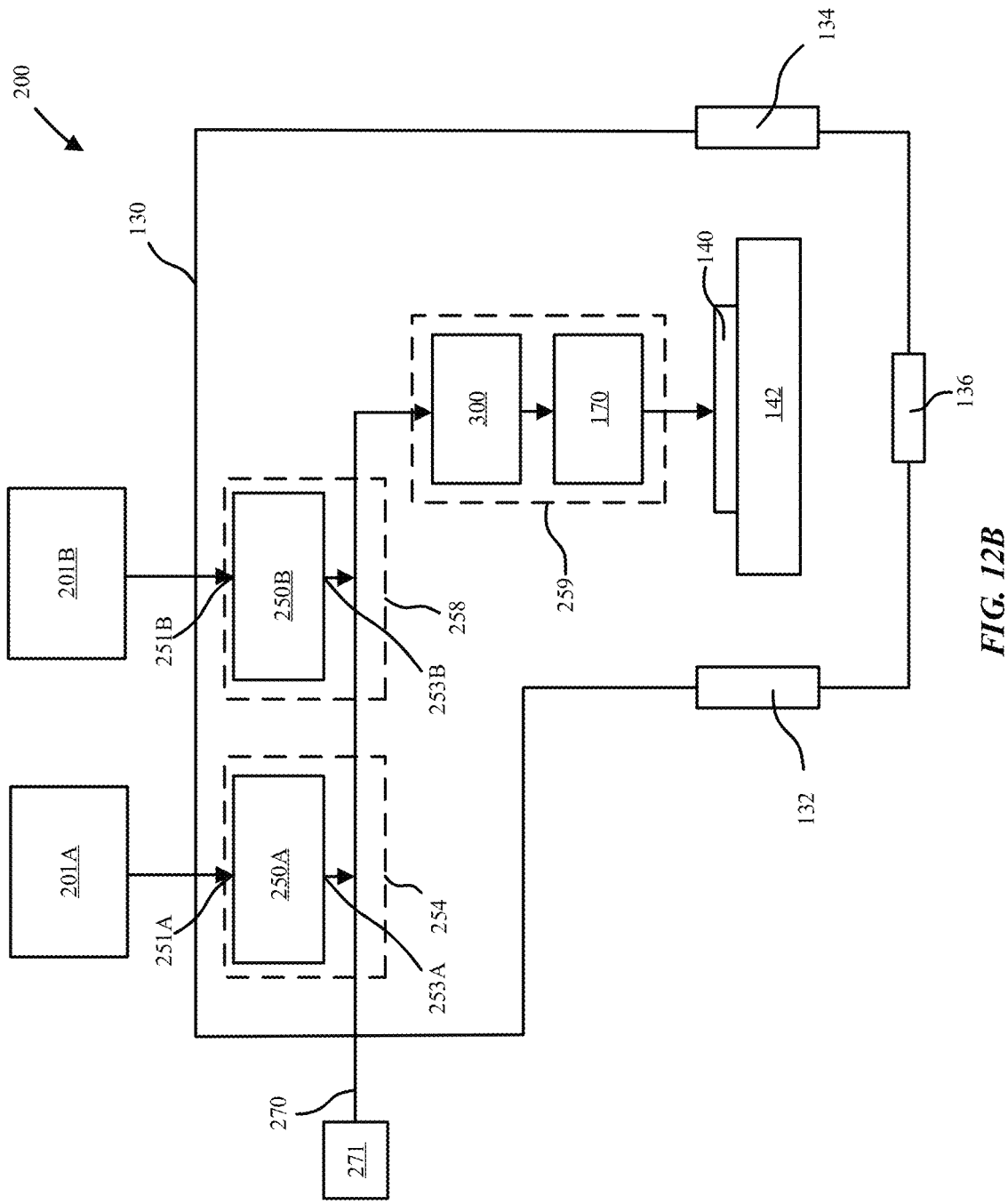
FIGS. 12B and 13B are schematic illustrations of VPT systems with in-line vaporization feeds into a supplemental carrier gas stream in accordance with embodiments.
Figure 13A:
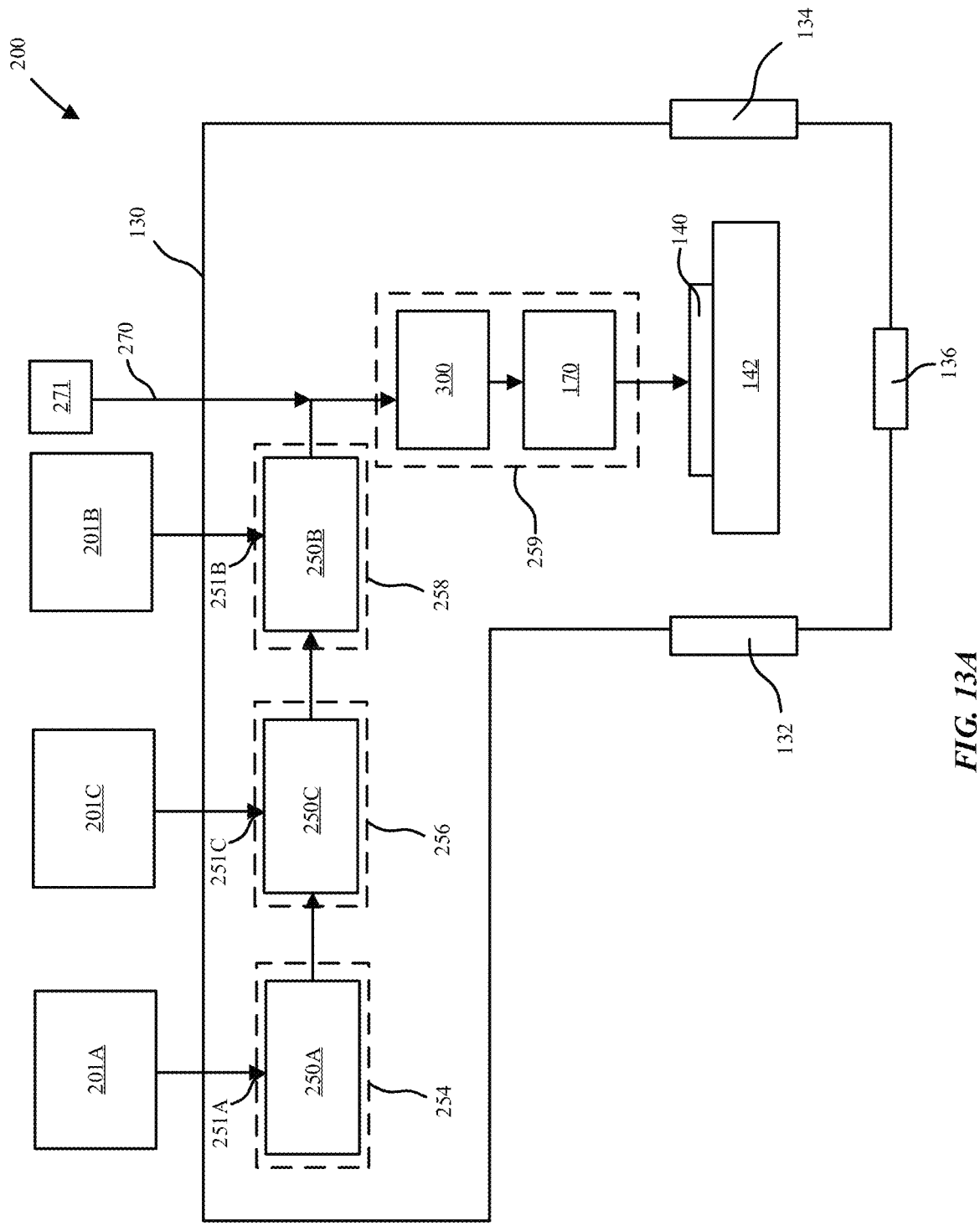
Figure 13B:
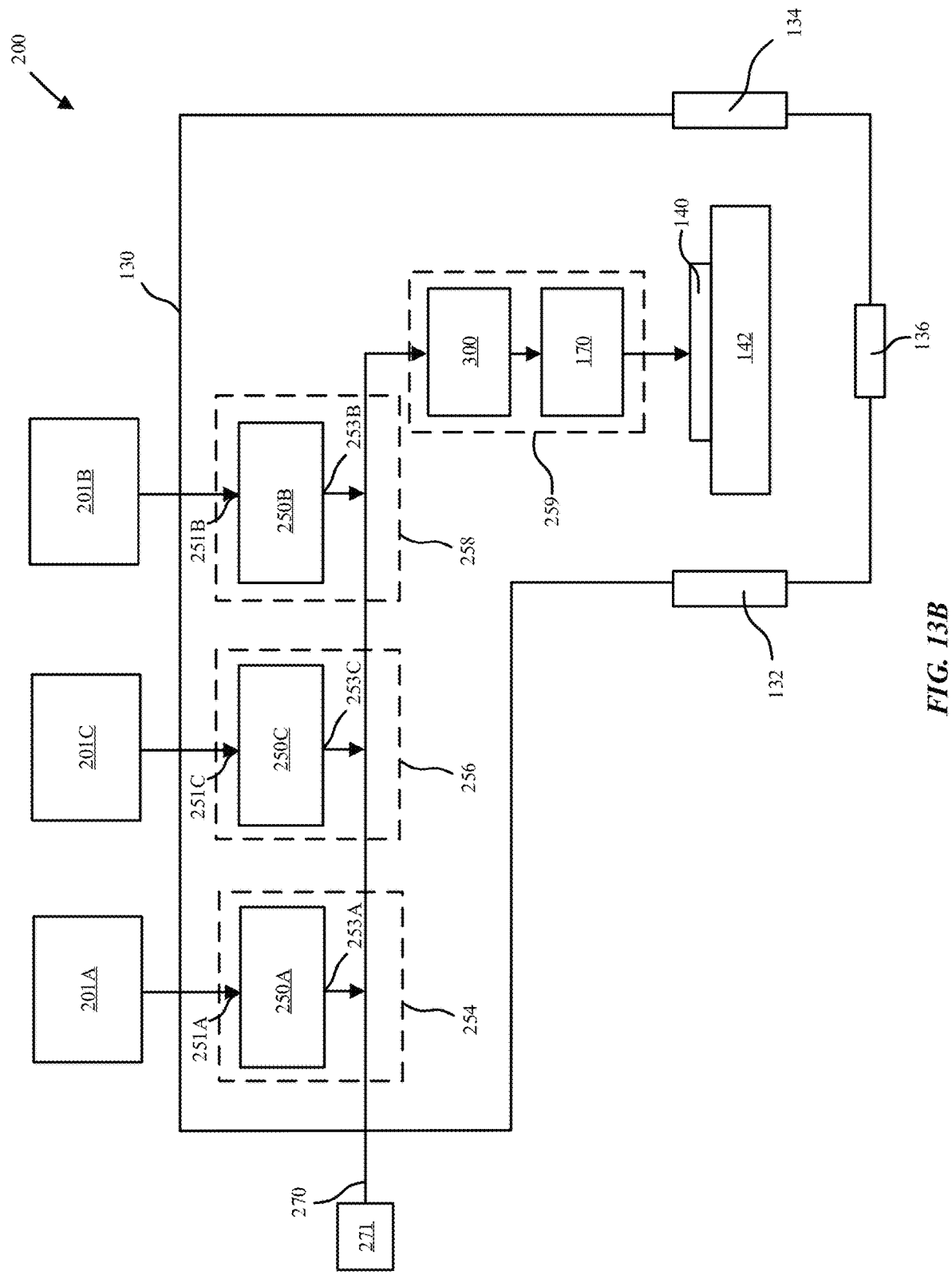

Referring now to FIGS. 12A-13B schematic illustrations of VTD systems are provided with in-line vaporization in accordance with embodiments. FIGS. 12A and 13A are similar to the VTD system of FIG. 11, with a notable difference being that the vaporization zones are in-line. FIGS. 12B and 13B are variations illustrating in-line vaporization feeds into a supplemental carrier gas stream. As shown in FIG. 12A, the second vaporizer 250B is downstream from the first vaporizer 250A. In the embodiment illustrated, the first and second vaporizers 250A, 250B are separate components. For example, a first outlet 253A of the first vaporizer 250A can be coupled with a second inlet 255B of the second vaporizer 250B (e.g. with a supply line 260) such that the second vaporizer 250B is downstream from the first vaporizer 250A. Alternatively, the precursor supply assemblies 201A, 201B feed into a shared vaporizer. In such a configuration, the shared vaporizer may have different vaporization sections of a sub-chamber (e.g. ceramic tube) heated to different temperatures of the temperature zones 254, 258. In either in-line configuration, the precursor vaporized in vaporizer 250A is flowed into the vaporizer 250B, which is maintained at a higher temperature to vaporize a second precursor. Thus, the first precursor vapor is subjected to a higher temperature when flowed into the second vaporizer 250B and high temperature zone 258. In accordance with embodiments turbulence is not intentionally introduced in the vaporization zones, and instead laminar or molecular flow can be maintained which helps reduce residency time and reduce degradation. Mixing can be postponed until entering a mixing zone downstream from the vaporization zones, though sufficient mixing may occur with the laminar or molecular flow in some embodiments.

In one implementation, in-line vaporization may be used to control the rate of vaporization of the first (lower temperature organic) precursor. Where precursors are separately fed to different temperature zones and/or different vaporizers, then vaporization rate may be controlled more independently compared to flashing all precursors in the same temperature zone. This may allow for semi-continuous feeding to be evened out with vaporization rate of the precursor.

In the embodiment illustrated in FIG. 12B the precursor vapors are fed into a supplemental carrier gas stream in supply line 270. In this configuration, the precursor vapor from the first vaporizer 250A is not required to flow into the second vaporizer 250B. In the embodiment illustrated the supply line 270 also flows through the cooler temperature zone 254 and high temperature zone 258 before flowing into the elevated temperature zone 259. In another embodiment the supply line can be maintained at elevated temperature zone 259 temperature, which is selected to maintain sufficient temperature to prevent sticking of the precursors. This may additionally reduce exposure time of the lower temperature precursors to higher temperatures used to vaporize/sublimate higher temperature precursors. For example, in an embodiment, first precursor supply assembly 201A supplies an organic precursor supplement, while the second precursor supply assembly 201B supplies a perovskite constituent powder including organic and inorganic components. The precursor vapor from vaporizer 250A is then used to supplement the precursor vapor from vaporizer 250B.

Referring now to FIGS. 13A-13B the VTD systems are similar to that of FIGS. 12A-12B with the addition of an intermediate vaporizer 250C and intermediate precursor supply assembly 201C coupled with an inlet 251C of the intermediate vaporizer 250C. In the configuration of FIG. 4A, the intermediate vaporizer 250C is downstream from the first vaporizer 250A, and the second vaporizer 250B is downstream from the intermediate vaporizer 250C. In the configuration of FIG. 4B, the outlet 253C of intermediate vaporizer 250C feeds into the supply line 270 downstream from outlet 253A of vaporizer 250A, and the outlet 253B of the second vaporizer 250B feeds into the supply line 270 downstream from the intermediate vaporizer 250C. In an embodiment, intermediate temperature zone 256 is at an intermediate temperature between the cooler temperature zone 254 and the high temperature zone 258. In an embodiment, the first precursor supply assembly 201A supplies an organic precursor (e.g. organic halide), the intermediate precursor supply assembly 201C supplies a metal halide precursor, and the second precursor supply assembly 201B supplies an alkali halide precursor. In this configuration, the in-line vaporization assembly can be arranged in order of temperatures required to vaporize/sublimate the precursors, and only expose the lowest temperature precursors to the highest temperature at the end of the feeding sequence. These exemplary precursor supplies and temperature zones are merely exemplary however, and other arrangements are contemplated in accordance with embodiments. In the embodiment illustrated the supply line 270 also flows through the cooler temperature zone 254, into the intermediate temperature zone 256, then the high temperature zone 258 before flowing into the elevated temperature zone 259. In another embodiment the supply line 270 can be maintained at elevated temperature zone 259 temperature, which is selected to maintain sufficient temperature to prevent sticking of the precursor vapors.

The configurations of FIGS. 11-13B may allow for a more controlled vaporization sequence as opposed to flash vaporization/sublimation of all precursors simultaneously. While the configurations are illustrated separately, it is to be appreciated that several features may be combined. For example, in-line vaporization of FIGS. 12A-13B may be combined with separate vaporization fluid streams so that some in-line precursor vapors can be first combined with another precursor vapor at a mixer as opposed to in a vaporizer or supplemental carrier gas supply line. Additionally, multiple precursors may be separately fed into a single vaporizer, or additional precursor supply assemblies and vaporizers can be added.

In accordance with embodiments, including systems of FIGS. 11-13B and variations and combinations thereof, residence time in the vapor phase case depends on a combination of process parameters, including temperature, pressure, concentration, and particle size (for solid precursors). These parameters can be tuned to decrease the extent of reaction or degradation of the organic components in particular. Disturbances in the flow due to eddies caused by turbulence or filtration can increase the residence time of some portion of the constituent perovskite vapor, leading to the potential for a higher proportion of the organic constituents undergoing thermal degradation.

In some exemplary implementations, the carrier gas(es) (e.g. nitrogen) flows through the vaporizer(s) and/or supply lines at elevated temperature corresponding to the temperature zone(s). At such high temperatures, the carrier gas will have expanded significantly, increasing the flow velocity into the m/s range even for larger diameter transfer tubing. At such a flow rate, the precursor vapors can travel through the vaporizer(s) and/or supply lines, as well as to the target substrate in under two seconds unless it experiences flow disruption in the form of eddies (caused by turbulent flow) or filtration. In accordance with embodiments, mixing can occur downstream from the vaporization zones. Mixing may additionally, or alternatively occur in the vaporizers or supply line(s) where laminar or molecular flow can be maintained. Such a process flow differs significantly from a conventional VTD system in which turbulence is intentionally created in the vaporization zone to mix the precursors. For example, even in an in-line vaporization system such as in FIGS. 12A-13B, turbulent flow may not be intentionally created inside the vaporizers or supply lines.

Figure 14:
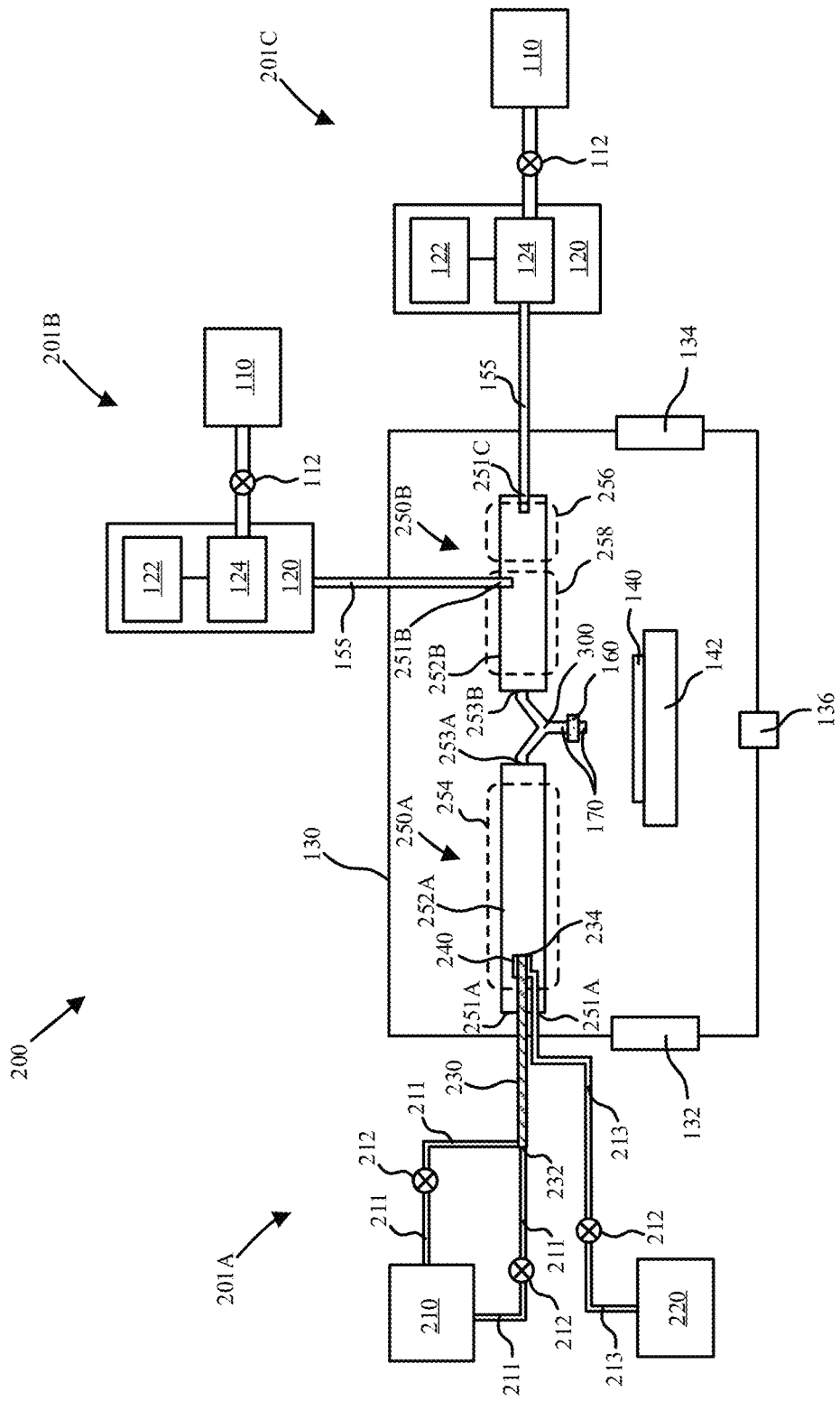
FIG. 14 is a schematic illustration of a VPT system including a solid precursor supply assembly and liquid precursor supply assembly in accordance with embodiments.

FIG. 14 is a schematic illustration of a VTD system including a solid precursor supply assembly and liquid precursor supply assembly in accordance with embodiments. In particular, the exemplary VTD system illustrated in FIG. 14 is to be understood as one possible implementation in which various precursor supply assemblies 201A, 201B, 201C are combined in a single system to separately deliver a variety of precursors. It is however to be understood that embodiments are not so limited, and a variety of combinations of precursor supply assemblies, vaporizers, vaporization zone, etc. are contemplated. Furthermore, additional vaporized precursors can be supplied with FIG. 14 with a supplemental gas supply 271 and supply line 270.

In the particular embodiment illustrated, a first precursor supply assembly 201A is a liquid precursor supply assembly such as that illustrated and described with regard to FIG. 3, while the second precursor supply assembly 201B and optional third precursor supply assembly 201C are similar those illustrated and described with regard to FIG. 2. In the exemplary arrangements, the second and third precursor supply assemblies 201B, 201C are fed into the same vaporizer 250B, though this is not required, and they may be fed into separate vaporizers. Similarly, the first precursor supply assembly 201A is fed into a separate vaporizer 250A, though this is also not required.

The vaporizer 250A illustrated in FIG. 14 includes a sub-chamber 252A, such as a quartz tube, which includes one or more inlets 251A and outlet 253A and could be a manifold made fully of one material such as quartz or other ceramic or metal. Alumina, mullite, silicon carbide, stainless steel, nickel-chromium-based alloy, or graphite tubes may also be used. The tube may optionally be completely enclosed along its longitudinal length. For example, the tube may radially enclose the interior zone. Furthermore, ends of the tube may optionally be capped or exposed to vacuum from the vacuum chamber. As illustrated the gas inflow component inlet 251A and the liquid precursor supply component inlet 251A are located at a first end of the tube, and the outlet 253A is at a second end of the tube. The tube may see vacuum through the outlet 253A which is exposed to the vacuum chamber 130 pressure. Thus, in an embodiment the sub-chamber 252A is exposed to the vacuum chamber 130 pressure through the deposition head 170. In such an embodiment, the sub-chamber 252A ends may otherwise be capped creating a closed zone where the sub-chamber 252A is connected to the vacuum chamber 130 through optional deposition head 170. As illustrated, the vaporizer 250A, including sub-chamber 252A, is located inside the vacuum chamber 130. Though this is not strictly required, and the sub-chamber 252A may also be located outside the vacuum chamber 130 and still see the vacuum chamber pressure through the deposition head 170. The sub-chamber 252A, or quartz tube, may extend through one or more furnaces of the vaporizer 250A that correlate to one or more temperature zones 254, 256, 258, etc. In the embodiment illustrated, vaporizer 250A includes a furnace to provide cooler temperature zone 254, and organic precursors are fed from the precursor supply assembly 201A into the vaporizer 250A.

The vaporizer 250B illustrated in FIG. 14 may similarly include a sub-chamber 252B, such as a quartz tube, which includes one or more inlets 251B, 251C and outlet 253B and could be a manifold made fully of one material such as quartz or other ceramic or metal. Alumina, mullite, silicon carbide, stainless steel, nickel-chromium-based alloy, or graphite tubes may also be used. The tube may be completely enclosed along its longitudinal length. Additionally, one or more inlets (e.g. 251B) may be located along the longitudinal length between the first and second ends of the tube. The tube for sub-chamber 252B may see vacuum similarly as the tube for sub-chamber 252A. In the particular configuration illustrated in FIG. 14, multiple solid precursor supply components 201B, 201C are connected to the sub-chamber 250B in multiple temperature zones 256, 258. Multiple furnaces may be around the sub-chamber 251B to provide the temperature zones 256, 258. In this manner different precursors may be fed to different temperature zones of the sub-chamber 252B in an in-line manner.

In an embodiment, the high temperature zone 258 is maintained at a higher temperature than the intermediate temperature zone 256, which is maintained at a higher temperature than the cooler temperature zone 254. For example, organic precursors (e.g. organic halides) may be fed into the cooler temperature zone, metal halides fed into the intermediate temperature zone 256, and alkali halides fed into the high temperature zone 258. Temperature ranges for the temperature zones depend upon the precursors being vaporized/sublimated. In an example, cooler temperature zone 254 is maintained at 100-450° C. (e.g. 150-250° C.), high temperature zone 258 is maintained at 450-1,000° C. (e.g. greater than 400° C. if Cs is not a perovskite precursor component, and greater than 600° C. if Cs is a perovskite precursor component), and intermediate temperature zone 256 is maintained at 350-500° C. For example, these temperature zone 254, 256, 258 temperatures may correspond to temperatures used to vaporize organic halides, metal halides, and alkali halides, respectively. The sub-chambers 252A, 252B may be held at low vacuum pressure (e.g. less than 50 Torr, and more specifically $10^{-4}$-10 Torr, such as $10^{-4}$-$10^{-2}$ Torr) which helps increase the vapor pressure of the perovskite precursors and increase the evaporation rates.

The precursor vapors existing outlets 253A (e.g. organic precursor vapor) and 253B (e.g. inorganic precursor vapor) are then directed to a mixer 300 and deposition head 170 for deposition as a perovskite film into the substrate 140. A variety of configurations are possible for the mixer 300 and deposition head 170.

In one aspect, embodiments describe various configurations that may minimize the amount of time at which the organic halide precursors are at high temperature in the vapor phase, since they can decompose over time at the temperatures necessary to evaporate the inorganic precursors and the temperatures necessary to prevent the inorganic precursors from sticking to the walls of the vaporization zones. The degradation of the organic halides follows first order reaction rate kinetics. Thus, the extent of degradation is dependent upon the process pressure, concentration of the organic, temperature, and reaction time. Minimizing each of these factors will minimize the extent to which the organic component degrades before deposition. Thus, when the low and high temperature vapor streams from outlets 253A and 253B are brought together, for example within a optional mixer 300, each of these factors can be minimized. The temperature of the optional mixer 300 and optional deposition head 170 in the elevated temperature zone 259 may need to be just high enough for the inorganic components to not deposit on the walls of the zone (e.g. 300-500° C. if no Cs, and 450-750° C. if Cs is a component). Pressure and concentration of the organic species within the vapor are the most influential parameters with changes in these factors leading to proportional change in the extent of degradation. Finally, residence time in this zone is also directly proportional to the extent of degradation of the organic precursors and thus will be minimized, ideally the residence time would be less than two seconds, or more specifically less than 0.5 seconds.

The optional mixer 300 and optional deposition head 170 can be designed to minimize the extent of degradation of the organic cations and organic halides. The mixer 300 can provide sufficient mixing of the organic and inorganic halide precursors to prevent significant compositional gradients and enable uniformity in deposition through the deposition head 170. In accordance with embodiments, the mixer 300 and deposition head 170 are each a part of an optional mixing nozzle designed to maintain laminar or molecular flow and prevent turbulent flow in order to minimize the residence time of the organics in the mixer and deposition head.

Figure 15:
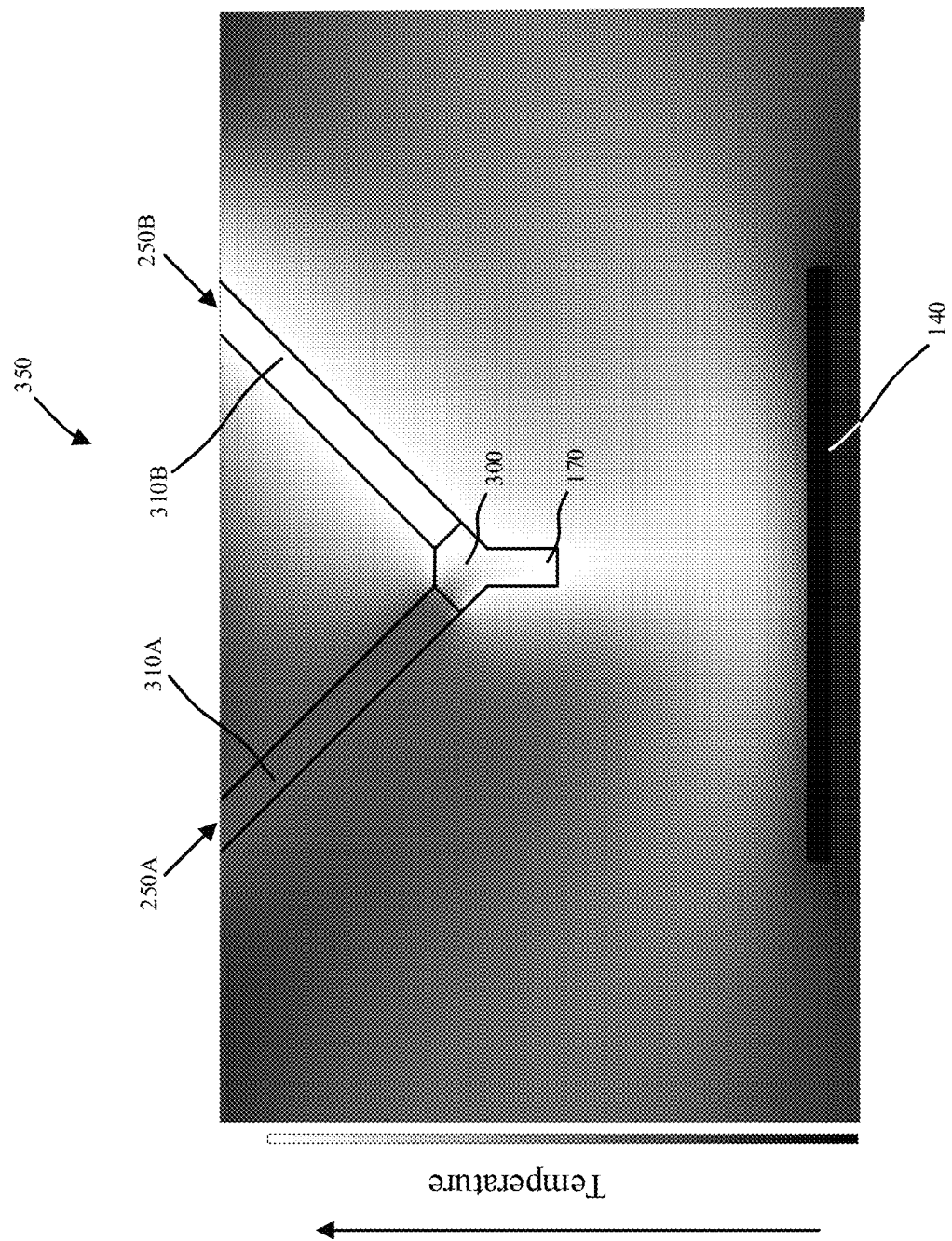
FIG. 15 is a schematic illustration of a vapor temperature flowing through a y-shaped mixing nozzle in accordance with an embodiment.

FIG. 15 is a schematic illustration of a vapor temperature flowing through a y-shaped mixing nozzle 350 in accordance with an embodiment. The mixing nozzle 350 can include one or more arms coupled to vaporizer outlets. The particular y-shaped mixing nozzle 350 illustrated includes arm 310A coupled with outlet 253A of vaporizer 250A, while arm 310B is coupled with outlet 253B of vaporizer 250B. As illustrated, lower temperatures are darker. Thus, the organic precursor vapor may be at a lower temperature in arm 310A than the inorganic precursor vapor in arm 310B. The arms meet at mixer 300, where the vapors are mixed to form the constituent vapor, which flows through the deposition head 170 and is deposited onto the substrate 140. As shown, the deposition head 170 may be a simple as a tube, though additional structures may be added. Such a process flow differs significantly from a conventional VTD system in which turbulence is intentionally created in the vaporization zone to mix the precursors.

Typical fluid mixers rely on turbulence in order to achieve sufficient mixing of the fluids, where the Reynolds number is increased either by introducing walls to impede fluid flow and cause it to change directions, constraining the mixing zone volume to increase fluid velocity, or using narrower flow channels and wider openings to create quick changes in the flow's length parameter. However, turbulence can lead to eddy currents which can inadvertently increase the residence time of the organic halides in the mixing nozzle. Thus, the mixing nozzles 350 in accordance with embodiments may maintain laminar or molecular flow in order to reduce the chance of eddy currents forming and the flow churning. The mixing nozzle 350 brings the organic and inorganic flows together, but a large mixing zone allows the flows to maintain Reynolds number below 2,000. The low pressure of the system leads to a lower Reynolds number due to the lower density. For the purposes of the system design, the carrier gas flow rate, inlet pipe (e.g. arm 310A, 310B, etc.) diameters, and outlet (e.g. deposition head 170) diameter are the largest controls. Note that the lower temperature organic flow will rapidly expand upon entering the mixer of the mixing nozzle.

The Reynolds number (Re) for a mixing nozzle 350 may be calculated using equation 1, $$Re = \frac{\rho u l}{\mu} \qquad (1)$$

where $\rho$ is density, u is fluid velocity, l is the fluid's length parameter (typically the diameter through which the fluid is flowing), and $\mu$ is the fluid's dynamic viscosity. A Re<<1 implies a molecular flow regime also associated with creeping or Stokes flow. A Reynolds number between 1-2,000 is laminar flow. A high Reynolds number above 4,000 is turbulent flow. While the mixer can be used at any pressure in accordance with embodiments, it may be most relevant in the pressure regimes between 0.1-10 Torr. At pressures lower than 0.1 Torr, the flow will enter a molecular flow regime or Stokes flow, where ballistic transport dominates rather than the vapor following laminar flow lines. As can be seen from the Reynolds equation, Reynolds number is directly proportional to fluid density and thus the Reynolds number is also directly proportional to chamber pressure. The same mixing nozzle may be used in the molecular flow regime as a nozzle can still control the directionality of a molecular flux towards the substrate. However, it can be much easier to mix vapor streams in the molecular flow regime, since the vapor no longer follows distinct flow lines, and the optional mixer may not be necessary.

Referring again to FIG. 8, a filter 160 may optionally be located within, or downstream of the vaporizers. A filter 160 is illustrated at the end of the deposition head 170, though it may be located before or after the vaporizer outlets, or within the vaporizers. Filter 160 may be designed as described elsewhere herein.

The constituent vapor is then directed through a deposition head 170 onto a substrate which is cooled below 200° C., or more specifically below 150° C. If the substrate 140 is too hot, the perovskite will not deposit/stick as well. Note here that if liquid vaporizers are utilized, the substrate should be maintained above the vaporization temperature of the solvent(s) used to prevent the solvent(s) from precipitating onto the substrate and dissolving the perovskite film. In accordance with embodiments, the optional deposition head 170 and filter 160 do not need to be heated to as high of temperature as the vaporization zone inside the vaporizer; they must be heated just hot enough for the perovskite vapor to not stick, which may be above approximately 450° C. for Cs containing perovskites and above 300° C. for perovskites not containing Cs.

Figure 16:
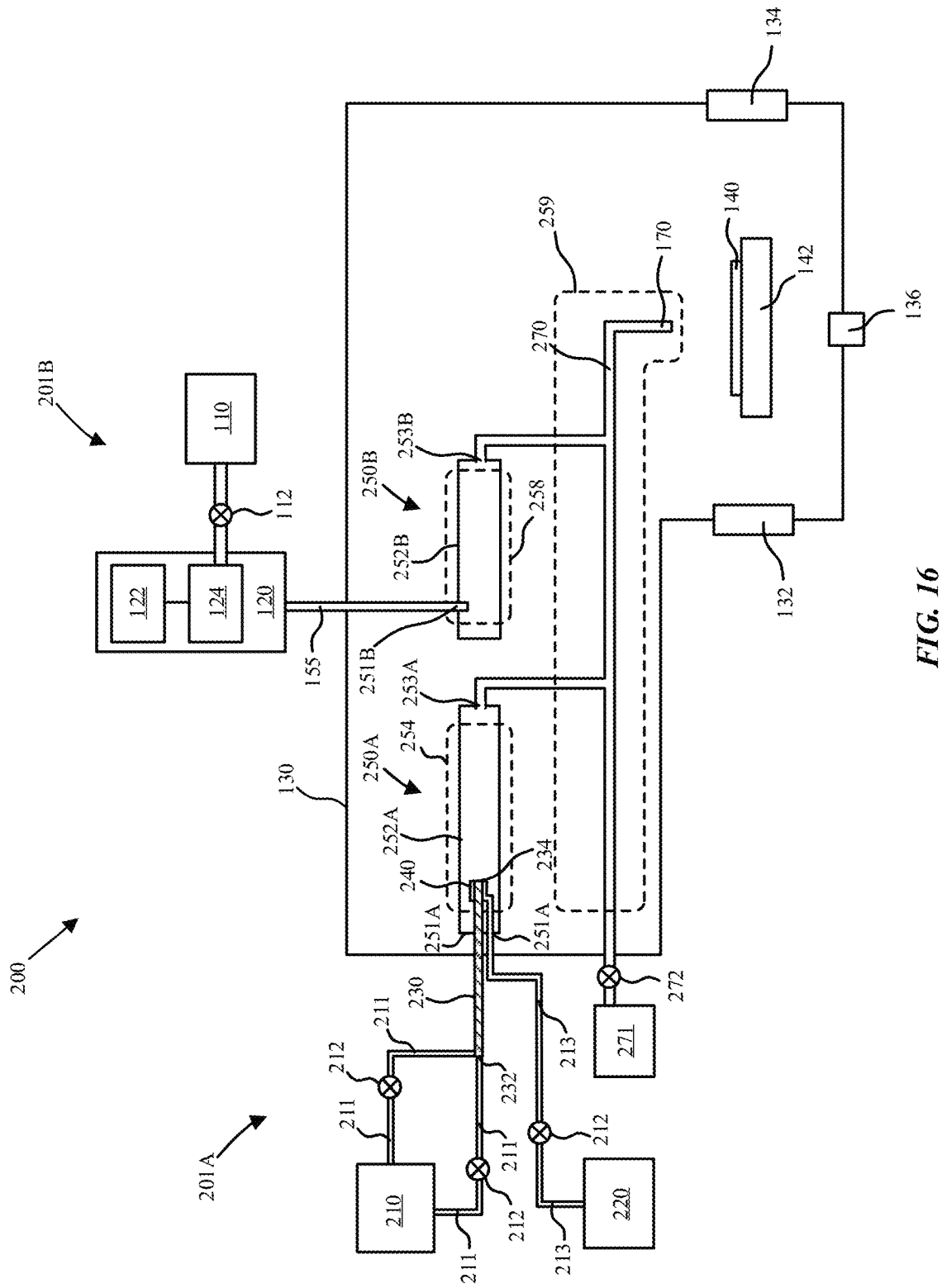
FIG. 16 is a schematic illustration of a VPT system including a solid precursor supply assembly and liquid precursor supply assembly in accordance with embodiments.

Referring now to FIG. 16 another embodiment of a VTD system is provided including a solid precursor supply assembly and liquid precursor supply assembly. In particular, the embodiment illustrated in FIG. 16 is a specific implementation of the various VTD systems possible as described and illustrated with regard to FIG. 12B. Similar to FIG. 14, the VTD system 200 of FIG. 16 includes a liquid precursor supply assembly 201A and a solid precursor supply assembly 201B, each feeding into separate vaporizers 250A, 250B respectively. Outputs 253A, 253B from the vaporizers 250A, 250B both feed in an in-line configuration into the supply line 270 for the supplemental carrier gas, which is supplied by the supplemental gas source 271 and controller 272, such as a mass flow controller (MFC). The supply line 270 may extend through the cooler temperature zone 254 and high temperature zone 258 before entering the elevated temperature zone 259 as previously described with regard to FIG. 11. Alternatively, the supply line 270 may be maintained in the elevated temperature zone 259 as illustrated in FIG. 16.

In an embodiment, precursor supply assembly 201A supplies a liquid organic precursor, while precursor supply assembly 201B supplies a mixture of perovskite precursors including organic precursors (organic halides) and inorganic precursors (metal halides and alkali halides). In such a configuration the precursor supply assembly 201A can be used to supplement organic precursor loss due to degradation. In an alternative embodiment, precursor supply assembly 201B only supplies one or more inorganic precursors. Furthermore, the metal halides and alkali halides can be fed separately using multiple additional precursor supply assemblies and vaporizers. A variety of combinations are possible.

In utilizing the various aspects of the embodiments, it would become apparent to one skilled in the art that combinations or variations of the above embodiments are possible for depositing a perovskite film using VTD. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A vapor phase transport deposition method comprising:
    feeding a carrier gas flow and perovskite constituent powder into a vaporizer;
    vaporizing the perovskite constituent powder in the vaporizer to form a constituent vapor;
    flowing the constituent vapor through the vaporizer and onto a target substrate; and
    depositing the constituent vapor as a perovskite film on the target substrate.

2. The method of claim 1, wherein the constituent vapor is flowed through the vaporizer and onto the target substrate in less than two seconds.

3. The method of claim 2, wherein the constituent vapor is flowed through the vaporizer and onto the target substrate is less than 0.5 seconds.

4. The method of claim 2, wherein the perovskite constituent powder comprises a perovskite powder.

5. The method of claim 1, wherein the perovskite constituent powder comprises a mixture of an inorganic precursor powder and an organic precursor powder.

6. The method of claim 5, wherein the inorganic precursor powder comprises at least one inorganic powder selected from the group consisting of $PbI_2$, $SnI_2$, $PbBr_2$, $SnBr_2$, $PbCl_2$, $SnCl_2$, $SnF_2$, CsI, CsBr, CsCl, RbI, RbBr, RbCl, KI, KBr, and KCl.

7. The method of claim 5, wherein the inorganic precursor powder comprises a lead-tin-halide alloy precursor powder.

8. The method of claim 5, wherein:
the organic precursor powder comprises an organic halide powder; and
the organic halide powder comprises one or more materials selected from the group consisting of methylammonium iodide (MAI), formamidinium iodide (FAI), dimethylammonium iodide (DMA), phenethylammonium iodide, butylammonium iodide, and guanidinium iodide.

9. The method of claim 1, wherein the perovskite constituent powder is blended with an inert filler.

10. The method of claim 1, wherein the vaporizer maintains a high temperature vaporization zone above 500° C.

11. The method of claim 10, wherein the vaporizer is maintained a pressure of less than 10 Torr.

12. The method of claim 11, wherein the vaporizer is maintained at a pressure of $10^{-4}$-1 Torr.

13. The method of claim 11, further comprising flowing the constituent vapor through a filter prior to depositing the perovskite film.

14. The method of claim 13, wherein the filter is characterized by a porosity of at least 50 pores per inch.

15. The method of claim 13, wherein the filter is maintained at a temperature below the high temperature vaporization zone temperature.

16. The method of claim 13, wherein the filter comprises a wire mesh or foam.

17. The method of claim 16, wherein the filter is secured across the vapor path through a sub-chamber within the vaporizer through which the constituent vapor flows.

18. The method of claim 17, wherein the filter has substantially two-dimensional incoming and outgoing filter surfaces.

19. The method of claim 1, further comprising feeding a precursor vapor into the vaporizer and mixing the precursor vapor with the constituent vapor.

20. The method of claim 19, further comprising depositing the mixed precursor vapor and the constituent vapor as the perovskite film on the target substrate.

21. The method of claim 20, further comprising vaporizing an organic precursor to form the precursor vapor at a higher pressure than a pressure inside the vaporizer.

22. The method of claim 1, wherein the constituent vapor is flowed onto the target substrate with laminar flow at a chamber pressure of 0.1-10 Torr.

23. The method of claim 1, wherein the constituent vapor is flowed onto the target substrate with molecular flow at a chamber pressure of $10^{-4}$ Torr-0.1 Torr.

24. The method of claim 23, wherein the target substrate is positioned greater than 4 cm from a vapor source exit.

* * * * *